(12) United States Patent
Huang et al.

(10) Patent No.: US 12,310,051 B2
(45) Date of Patent: *May 20, 2025

(54) FIN FIELD-EFFECT TRANSISTOR DEVICE HAVING CONTACT PLUGS WITH RE-ENTRANT PROFILE

(71) Applicant: Taiwan Semiconductor Manufacturing Co., Ltd., Hsinchu (TW)

(72) Inventors: Yu-Lien Huang, Jhubei (TW); Guan-Ren Wang, Hsinchu (TW); Ching-Feng Fu, Taichung (TW); Yun-Min Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/402,407

(22) Filed: Jan. 2, 2024

(65) Prior Publication Data

US 2024/0145597 A1 May 2, 2024

Related U.S. Application Data

(60) Continuation of application No. 17/852,899, filed on Jun. 29, 2022, now Pat. No. 11,916,147, which is a
(Continued)

(51) Int. Cl.
*H10D 30/62* (2025.01)
*H01L 21/02* (2006.01)
(Continued)

(52) U.S. Cl.
CPC ..... *H10D 30/6211* (2025.01); *H01L 21/0217* (2013.01); *H01L 21/31116* (2013.01);
(Continued)

(58) Field of Classification Search
CPC ......... H01L 29/66795; H01L 29/41791; H01L 29/785; H01L 29/0847; H01L 21/823475;
(Continued)

(56) References Cited

U.S. PATENT DOCUMENTS 8,643,122 B2 2/2014 Alptekin et al.
9,685,535 B1 6/2017 Cheng et al.
(Continued)

FOREIGN PATENT DOCUMENTS

KR 20160136579 A 11/2016
KR 20170091434 A 8/2017
KR 20200037056 A 4/2020

*Primary Examiner* — Bac H Au
(74) *Attorney, Agent, or Firm* — Slater Matsil, LLP

(57) ABSTRACT

A method of forming a semiconductor device includes: forming a gate structure over a fin that protrudes above a substrate; forming source/drain regions over the fin on opposing sides of the gate structure; forming a first dielectric layer and a second dielectric layer successively over the source/drain regions; performing a first etching process to form an opening in the first dielectric layer and in the second dielectric layer, where the opening exposes an underlying electrically conductive feature; after performing the first etching process, performing a second etching process to enlarge a lower portion of the opening proximate to the substrate; and forming a contact plug in the opening after the second etching process.

20 Claims, 21 Drawing Sheets

Related U.S. Application Data division of application No. 16/870,345, filed on May 8, 2020, now Pat. No. 11,380,794.

(51) Int. Cl.
| | |
|---|---|
| *H01L 21/311* | (2006.01) |
| *H01L 21/3213* | (2006.01) |
| *H01L 21/768* | (2006.01) |
| *H10D 30/01* | (2025.01) |
| *H10D 62/822* | (2025.01) |
| *H10D 64/01* | (2025.01) |
| *H01L 21/223* | (2006.01) |
| *H01L 21/265* | (2006.01) |
| *H01L 21/266* | (2006.01) |
| *H10D 62/00* | (2025.01) |
| *H10D 62/13* | (2025.01) |

(52) U.S. Cl.
CPC .. *H01L 21/32139* (2013.01); *H01L 21/76802* (2013.01); *H01L 21/7682* (2013.01); *H01L 21/76877* (2013.01); *H10D 30/024* (2025.01); *H10D 30/6212* (2025.01); *H10D 62/822* (2025.01); *H10D 64/015* (2025.01); *H10D 64/017* (2025.01); *H01L 21/02164* (2013.01); *H01L 21/02271* (2013.01); *H01L 21/2236* (2013.01); *H01L 21/26513* (2013.01); *H01L 21/266* (2013.01); *H10D 62/021* (2025.01); *H10D 62/151* (2025.01); *H10D 64/021* (2025.01)

(58) Field of Classification Search
CPC ......... H01L 21/76831; H01L 21/76843; H01L 21/76897; H01L 21/7682; H10D 30/6211; H10D 30/024; H10D 30/6212; H10D 64/015

See application file for complete search history.

(56) References Cited

U.S. PATENT DOCUMENTS

| | | | |
|---|---|---|---|
| 9,859,393 | B2 | 1/2018 | Tak et al. |
| 9,876,094 | B2 | 1/2018 | Bae et al. |
| 9,899,522 | B1 | 2/2018 | Liu et al. |
| 10,177,038 | B1 | 1/2019 | Lee et al. |
| 10,199,260 | B1 | 2/2019 | Su et al. |
| 10,388,747 | B1 | 8/2019 | Xie et al. |
| 10,388,770 | B1 | 8/2019 | Xie et al. |
| 10,714,578 | B2 | 7/2020 | Huang |
| 10,734,410 | B2 | 8/2020 | Cheng et al. |
| 10,825,737 | B2 | 11/2020 | Lee et al. |
| 10,868,142 | B2 | 12/2020 | Chien et al. |
| 10,868,181 | B2 | 12/2020 | Li et al. |
| 10,916,477 | B2 | 2/2021 | Hung et al. |
| 10,937,877 | B2 | 3/2021 | Huang |
| 10,937,884 | B1 | 3/2021 | Wang et al. |
| 10,957,778 | B2 | 3/2021 | Cheng et al. |
| 10,971,408 | B2 | 4/2021 | Yeong et al. |
| 11,011,617 | B2 | 5/2021 | Lee et al. |
| 11,038,060 | B2 | 6/2021 | Huang |
| 11,380,794 | B2 * | 7/2022 | Huang .............. H01L 21/32139 |
| 2011/0024801 | A1 | 2/2011 | Cheng et al. |
| 2012/0164809 | A1 | 6/2012 | Yoon et al. |
| 2012/0241815 | A1 | 9/2012 | Kim et al. |
| 2013/0171795 | A1 | 7/2013 | Pei et al. |
| 2015/0243544 | A1 | 8/2015 | Alptekin et al. |
| 2016/0181383 | A1 | 6/2016 | Huang et al. |
| 2016/0225667 | A1 | 8/2016 | Zang |
| 2016/0343825 | A1 | 11/2016 | Bae et al. |
| 2016/0365426 | A1 | 12/2016 | Ching et al. |
| 2017/0179241 | A1 | 6/2017 | Chang et al. |
| 2017/0222014 | A1 | 8/2017 | Tak et al. |
| 2017/0323852 | A1 | 11/2017 | Hsu et al. |
| 2018/0151445 | A1 | 5/2018 | Hsu et al. |
| 2018/0166553 | A1 | 6/2018 | Lee et al. |
| 2019/0172752 | A1 | 6/2019 | Hsu et al. |
| 2019/0296123 | A1 | 9/2019 | Lee et al. |
| 2019/0333820 | A1 | 10/2019 | Chang et al. |
| 2019/0334011 | A1 | 10/2019 | Cheng et al. |
| 2019/0371898 | A1 | 12/2019 | Huang |
| 2019/0378909 | A1 | 12/2019 | Cheng et al. |
| 2019/0385896 | A1 | 12/2019 | Chiang et al. |
| 2020/0006228 | A1 | 1/2020 | Yang et al. |
| 2020/0020776 | A1 | 1/2020 | Yang et al. |
| 2020/0105867 | A1 | 4/2020 | Lee et al. |
| 2020/0127109 | A1 | 4/2020 | Wang et al. |
| 2020/0127110 | A1 | 4/2020 | Lee et al. |
| 2020/0135591 | A1 | 4/2020 | Yeong et al. |
| 2021/0050412 | A1 | 2/2021 | Wong et al. |
| 2021/0066500 | A1 | 3/2021 | Liu et al. |

* cited by examiner

FIN FIELD-EFFECT TRANSISTOR DEVICE HAVING CONTACT PLUGS WITH RE-ENTRANT PROFILE

PRIORITY CLAIM AND CROSS-REFERENCE

This application is a continuation of U.S. patent application Ser. No. 17/852,899, filed Jun. 29, 2022, entitled "Fin Field-Effect Transistor Device Having Contact Plugs with Re-Entrant Profile," which is a divisional of U.S. patent application Ser. No. 16/870,345, entitled "Fin Field-Effect Transistor Device Having Contact Plugs with Re-Entrant Profile," filed on May 8, 2020, (now U.S. Pat. No. 11,380,794, issued Jul. 5, 2022), which applications are incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
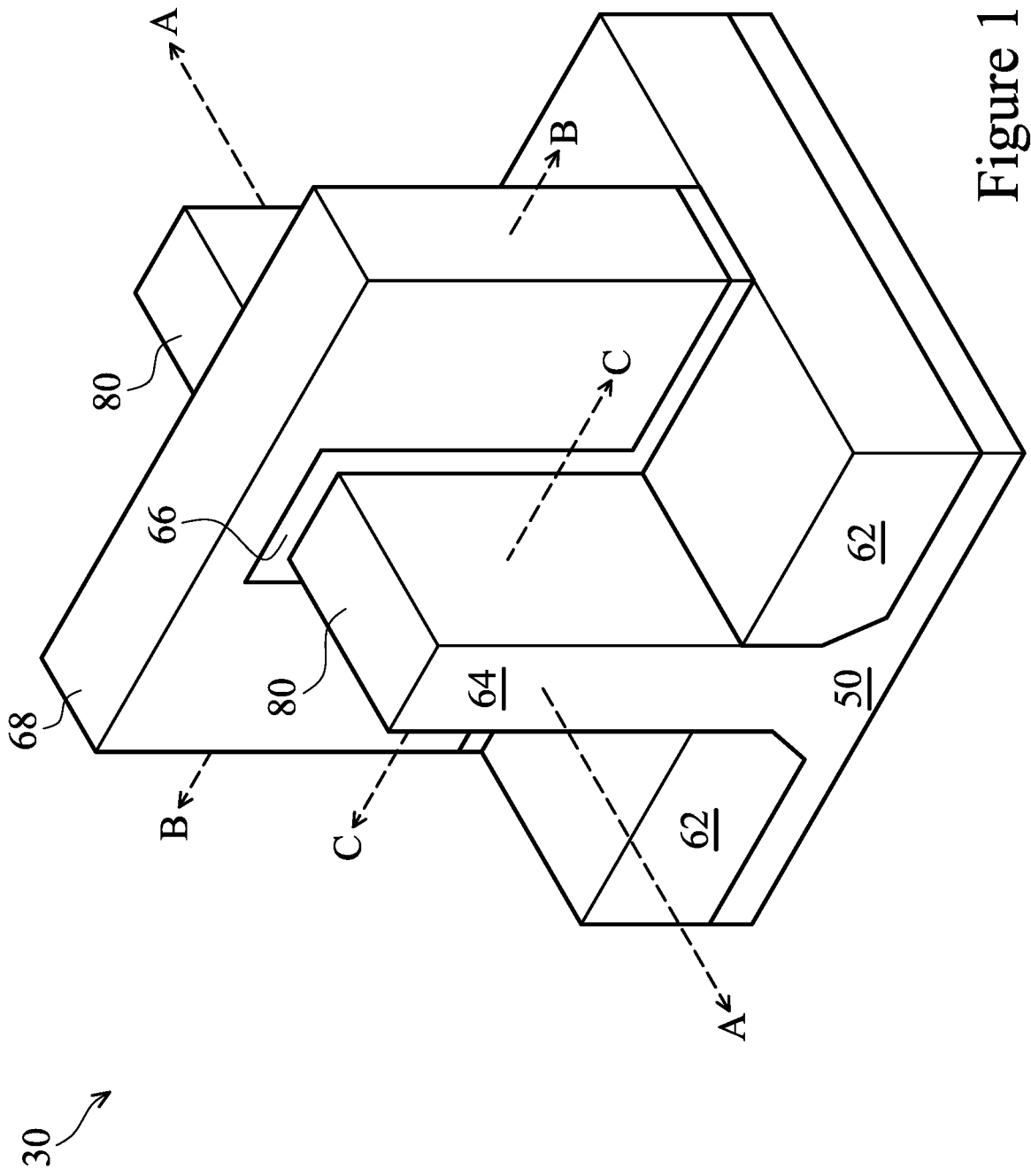
FIG. 1 illustrates a perspective view of a Fin Field-Effect Transistor (FinFET) device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same numeral in different figures refers to the same or similar component formed by a same or similar method using a same or similar material(s).

Embodiments of the present disclosure are discussed in the context of forming a FinFET device, and in particular, in the context of forming contact plugs with a re-entrant profile for a FinFET device. Although the disclosed embodiments are discussed using FinFET devices as examples, the disclosed methods may also be used in other types of devices, such as planar devices.

In some embodiments, a first dielectric layer and a second dielectric layer are formed over the source/drain regions of a FinFET device. An opening is formed in the first and second dielectric layers using a first etching process (e.g., an anisotropic etching process) to expose an underlying electrically conductive feature, which may be a source/drain region, a via connected to the gate structure of the FinFET device, or a via connected to a source/drain region. Next, a second etching process (e.g., an isotropic etching process) is performed to enlarge a lower portion of the opening, such that the lower portion of the opening has a curved sidewall profile, while the upper portion of the opening has a linear sidewall profile. A contact plug (may also be referred to as a via) is next formed in the opening by: forming a sacrificial layer along sidewalls of the opening; forming a spacer layer over the sacrificial layer; filling the opening with an electrically conductive material; and removing the sacrificial layer after filling the opening. An air gap is formed between the spacer layer and the first and the second dielectric layers after removing the sacrificial layer. The air gap may be sealed by forming another dielectric layer over the second dielectric layer. The enlarged lower portion of the opening results in an enlarged lower portion for the contact plug formed, thereby reducing the electrical resistance of the contact plug. In addition, the air gap advantageously reduces capacitance by reducing the average dielectric constant (K-value) of the dielectric material around the contact plug.

FIG. 1 illustrates an example of a FinFET 30 in a perspective view. The FinFET 30 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate electrode 68 is over the gate dielectric 66. Source/drain regions 80 are in the fin 64 and on opposing sides of the gate dielectric 66 and the gate electrode 68. FIG. 1 further illustrates reference cross-sections that are used in later figures. Cross-section B-B extends along a longitudinal axis of the gate electrode 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80. Subsequent figures refer to these reference cross-sections for clarity.

FIGS. 2-7, 8A, 9-13, and 14A-14C are cross-sectional views of a FinFET device 100 at various stages of fabrication in accordance with some embodiments. The FinFET device 100 is similar to the FinFET 30 in FIG. 1, but with multiple fins and multiple gate structures. FIGS. 2-5 illustrate cross-sectional views of the FinFET device 100 along cross-section B-B. FIGS. 6-7, 8A, 9-13, and 14A illustrate cross-sectional views of the FinFET device 100 along cross-section A-A. FIGS. 8B and 8C illustrate embodiment cross-sectional views of the FinFET device 100 along cross-section C-C. FIGS. 14B and 14C illustrates ross-sectional views of the FinFET device 100 along cross-section C-C and B-B, respectively. Throughout the discussion herein, unless otherwise specified, figures with the same number but different alphabets (e.g., FIGS. 14A and 14B) refer to different cross-sectional views of a same device at a same stage of fabrication.

Figure 2:
FIGS. 2-7, 8A, 9-13, and 14A-14C illustrate various cross-sectional views of a FinFET device at various stages of fabrication, in accordance with an embodiment.

FIG. 2 illustrates a cross-sectional view of the substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
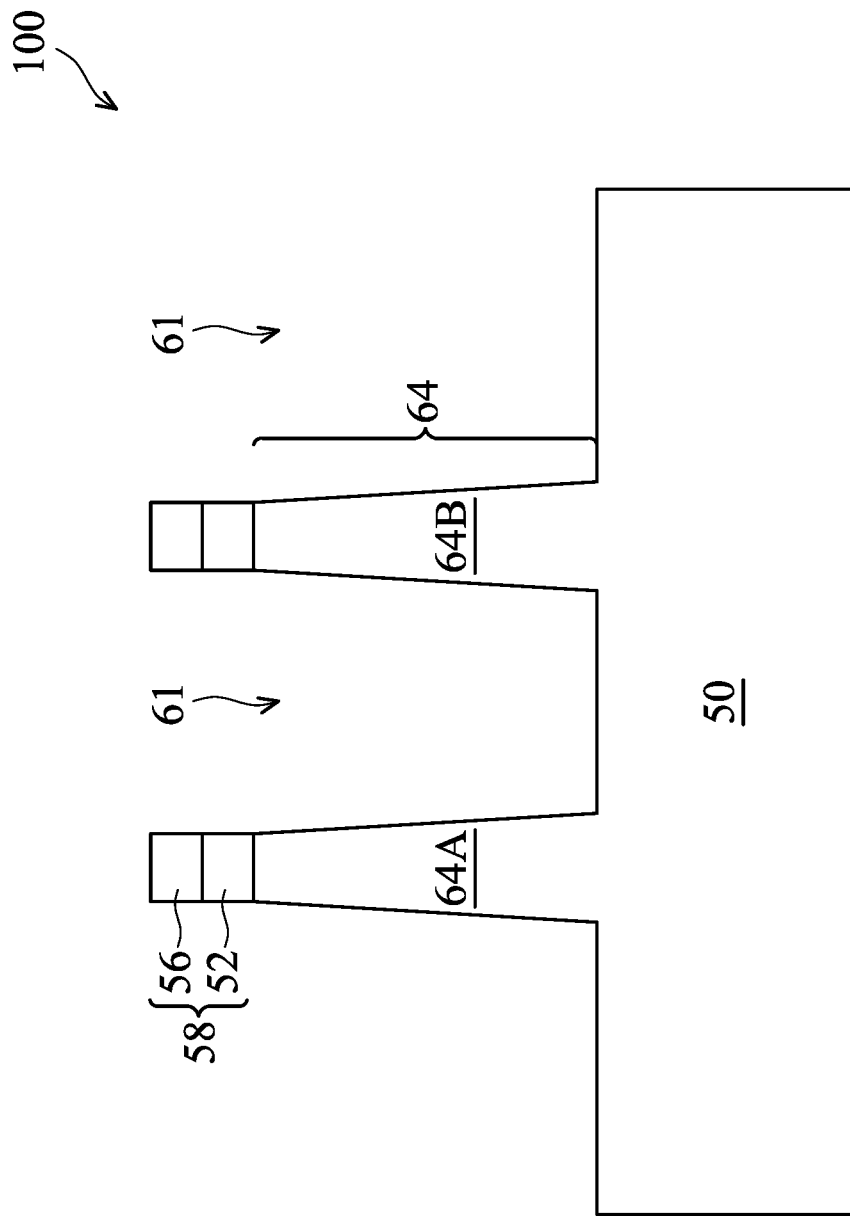

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56. In some embodiments, the pad nitride layer 56 is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fins 64 (e.g., 64A and 64B) between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etching process may be anisotropic. In some embodiments, the trenches 61 may be strips (viewed from in the top) parallel to each other, and closely spaced with respect to each other. In some embodiments, the trenches 61 may be continuous and surround the semiconductor fins 64. The semiconductor fins 64 may also be referred to as fins 64 hereinafter.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
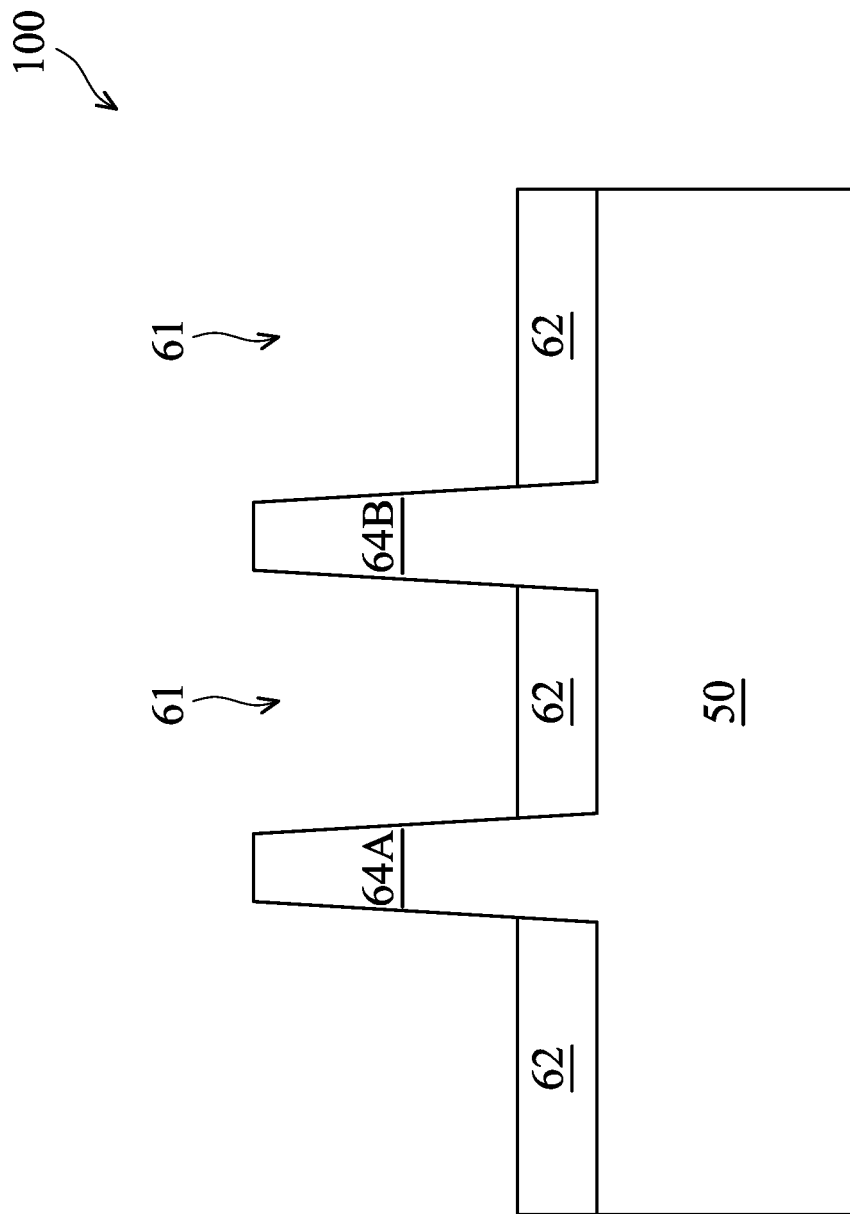

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 62 and top surfaces of the semiconductor fins 64 that are coplanar (not shown). The patterned mask 58 (see FIG. 3) may also be removed by the planarization process.

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor fins 64 protrude from between neighboring STI regions 62. The top surfaces of the STI regions 62 may have a flat surface (as illustrated), a convex surface, a concave surface (such as dishing), or a combination thereof. The top surfaces of the STI regions 62 may be formed flat, convex, and/or concave by an appropriate etch. The isolation regions 62 may be recessed using an acceptable etching process, such as one that is selective to the material of the isolation regions 62. For example, a dry etch, or a wet etch using dilute hydrofluoric (dHF) acid, may be performed to recess the isolation regions 62.

FIGS. 2 through 4 illustrate an embodiment of forming fins 64, but fins may be formed in various different processes. For example, a top portion of the substrate 50 may be replaced by a suitable material, such as an epitaxial material suitable for an intended type (e.g., N-type or P-type) of semiconductor devices to be formed. Thereafter, the substrate 50, with epitaxial material on top, is patterned to form semiconductor fins 64 that comprise the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 64 may comprise silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
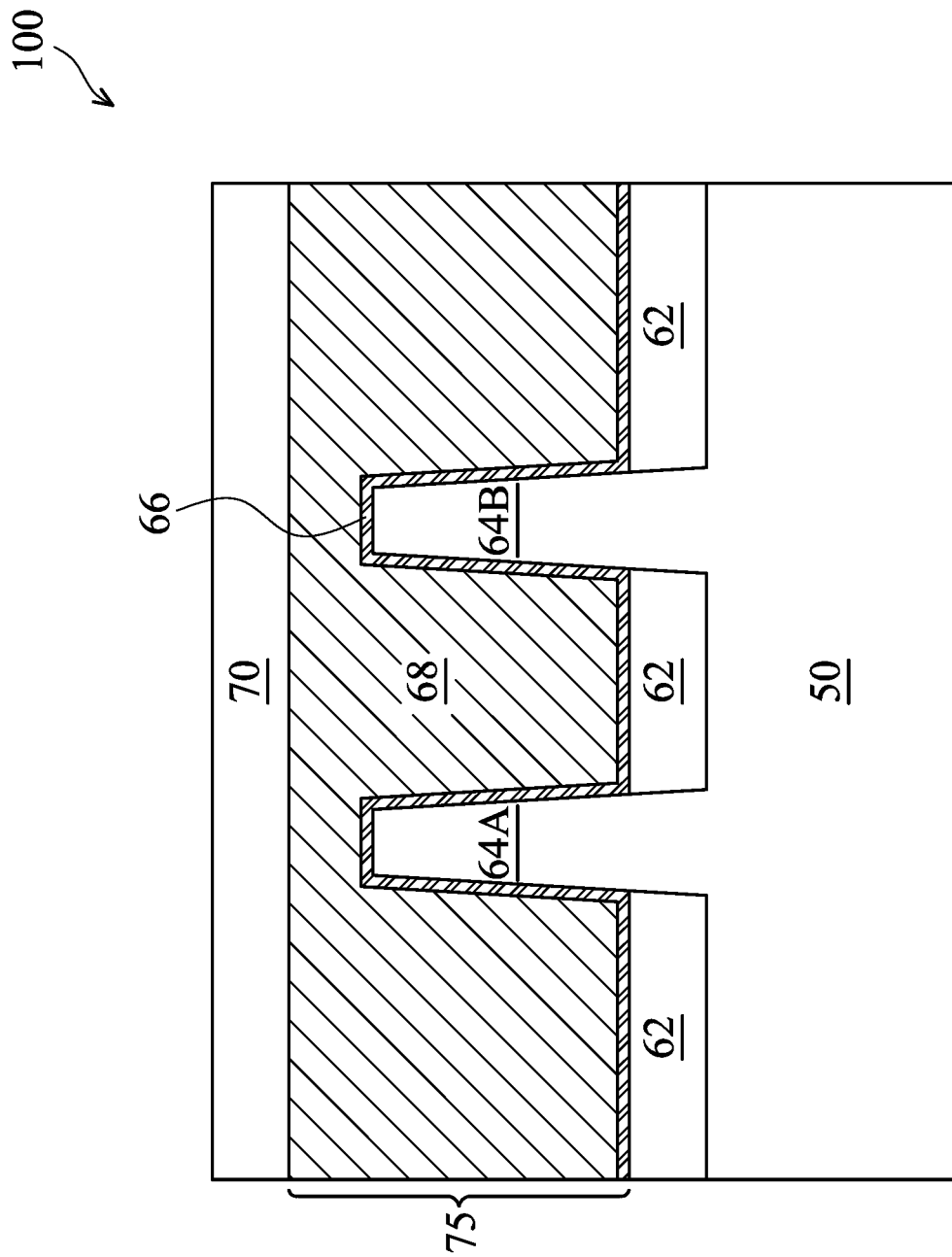

FIG. 5 illustrates the formation of dummy gate structure 75 over the semiconductor fins 64. Dummy gate structure 75 includes gate dielectric 66 and gate electrode 68, in some embodiments. A mask 70 may be formed over the dummy gate structure 75. To form the dummy gate structure 75, a dielectric layer is formed on the semiconductor fins 64. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 then may be transferred to the gate layer and the dielectric layer by an acceptable etching technique to form gate electrode 68 and gate dielectric 66, respectively. The gate electrode 68 and the gate dielectric 66 cover respective channel regions of the semiconductor fins 64. The gate electrode 68 may also have a lengthwise direction substantially perpendicular to the lengthwise direction of respective semiconductor fins 64.

The gate dielectric 66 is shown to be formed over the fins 64 (e.g., over top surfaces and sidewalls of the fins 64) and over the STI regions 62 in the example of FIG. 5. In other embodiments, the gate dielectric 66 may be formed by, e.g., thermal oxidization of a material of the fins 64, and therefore, may be formed over the fins 64 but not over the STI regions 62. These and other variations are fully intended to be included within the scope of the present disclosure.

FIGS. 6-7, 8A, 9-13, and 14A illustrate the cross-sectional views of further processing of the FinFET device 100 along cross-section A-A (along a longitudinal axis of the fin 64). Note that in FIGS. 6-7, 8A, and 9, three dummy gate structures 75 (e.g., 75A, 75B, and 75C) are formed over the fin 64. One skilled in the art will appreciate that more or less than three gate structures may be formed over the fin 64, these and other variations are fully intended to be included within the scope of the present disclosure.

Figure 6:
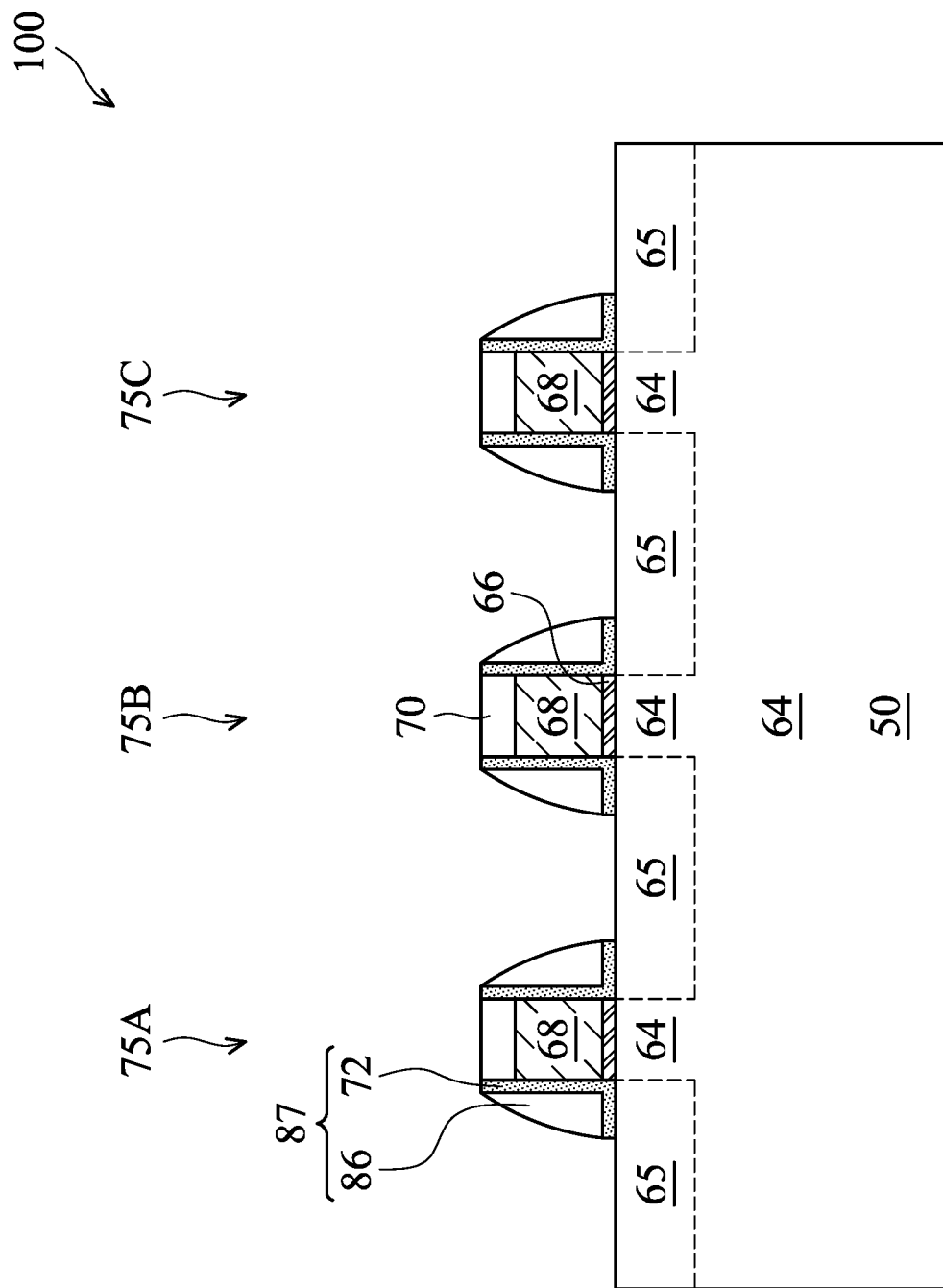

As illustrated in FIG. 6, lightly doped drain (LDD) regions 65 are formed in the fins 64. The LDD regions 65 may be formed by a plasma doping process. The plasma doping process may include forming and patterning masks such as a photoresist to cover the regions of the FinFET that are to be protected from the plasma doping process. The plasma doping process may implant N-type or P-type impurities in the fins 64 to form the LDD regions 65. For example, P-type impurities, such as boron, may be implanted in the fin 64 to form the LDD regions 65 for a P-type device. As another example, N-type impurities, such as phosphorus, may be implanted in the fin 64 to form the LDD regions 65 for an N-type device. In some embodiments, the LDD regions 65 abut the channel region of the FinFET device 100. Portions of the LDD regions 65 may extend under gate electrode 68 and into the channel region of the FinFET device 100. FIG. 6 illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 87 are formed. In some embodiments, the LDD regions 65 are omitted. For simplicity, the LDD regions 65 are not illustrated in subsequent figures, with the understanding the LDD regions 65 may be formed in the fin 64.

Still referring to FIG. 6, after the LDD regions 65 are formed, gate spacers 87 are formed around the dummy gate structures 75. The gate spacer 87 may include a first gate spacer 72 and a second gate spacer 86. For example, the first gate spacer 72 may be a gate seal spacer and is formed on opposing sidewalls of the gate electrode 68 and on opposing sidewalls of the gate dielectric 66. The second gate spacer 86 is formed on the first gate spacer 72. The first gate spacer 72 may be formed of a nitride, such as silicon nitride, silicon oxynitride, silicon carbonitride, the like, or a combination thereof, and may be formed using, e.g., a thermal oxidation, CVD, or other suitable deposition process. The second gate spacer 86 may be formed of silicon nitride, silicon carbonitride, a combination thereof, or the like using a suitable deposition method.

In an embodiment, the gate spacer 87 is formed by first conformally depositing a first gate spacer layer over the FinFET device 100, then conformally depositing a second gate spacer layer over the deposited first gate spacer layer. Next, an anisotropic etch process, such as a dry etch process, is performed to remove a first portion of the second gate spacer layer disposed on upper surfaces of the FinFET device 100 (e.g., the upper surface of the mask 70) while keeping a second portion of the second gate spacer layer disposed along sidewalls of the gate structures. The second portion of the second gate spacer layer remaining after the anisotropic etch process forms the second gate spacer 86. The anisotropic etch process also removes a portion of the first gate spacer layer disposed outside of the sidewalls of the second gate spacer 86, and the remaining portion of the first gate spacer layer forms the first gate spacer 72.

The shapes and formation methods of the gate spacer 87 as illustrated in FIG. 6 are merely non-limiting examples, and other shapes and formation methods are possible. These and other variations are fully intended to be included within the scope of the present disclosure.

Figure 7:
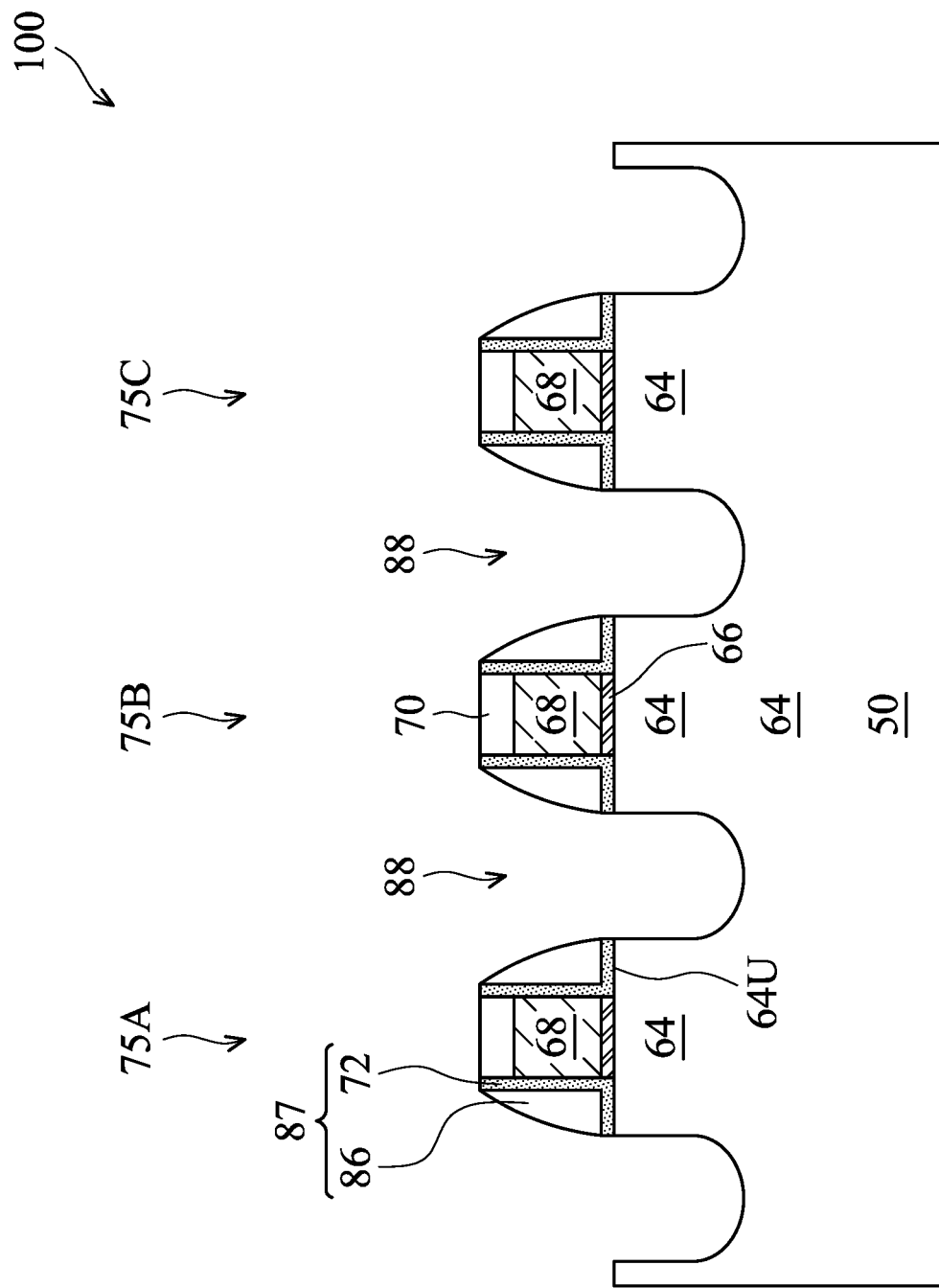

Next, as illustrated in FIG. 7, recesses 88 are formed in the fins 64 adjacent to the dummy gate structures 75, e.g., between adjacent dummy gate structures 75 and/or next to a dummy gate structure 75. The recesses 88 are formed by, e.g., an anisotropic etching process using the dummy gate structures 75 and the gate spacers 87 as an etching mask, in some embodiments, although any other suitable etching process may also be used.

Figure 8A:
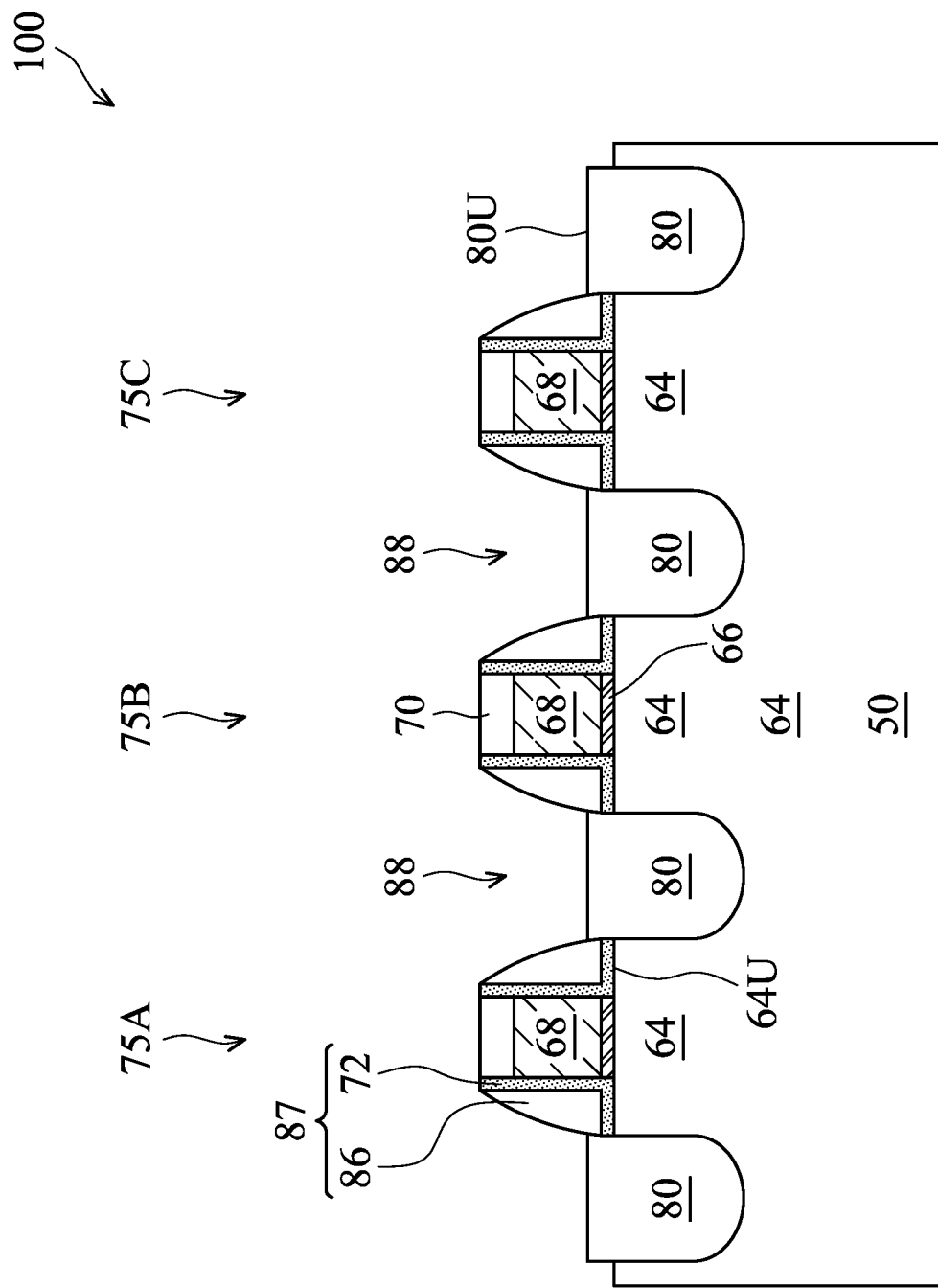
Figure 8B:
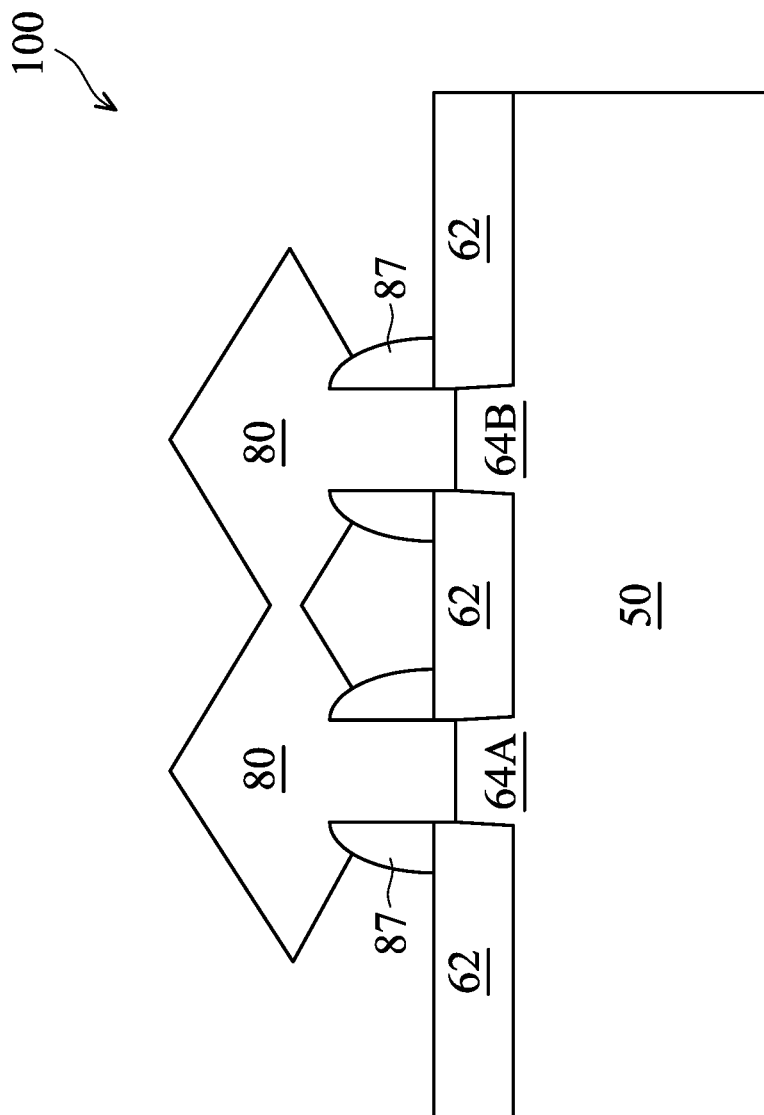
FIGS. 8B and 8C illustrate two embodiment cross-sectional views of the FinFET device in FIG. 8A.
Figure 8C:
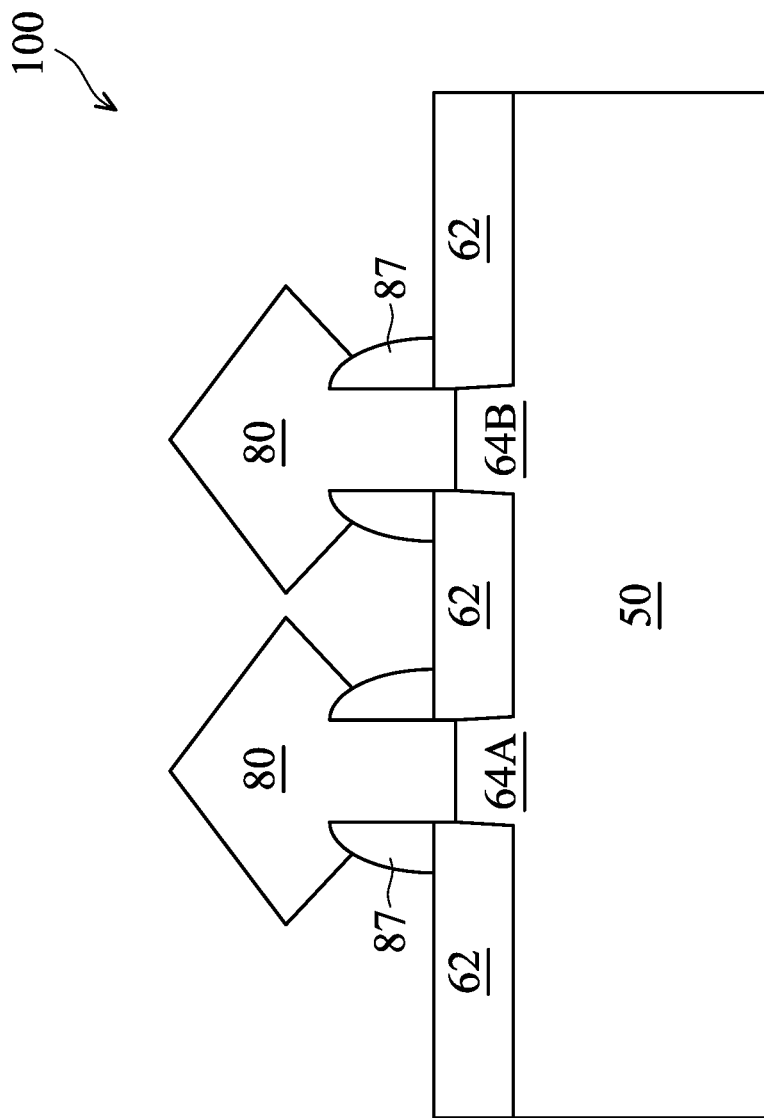

Next, as illustrated in FIG. 8A, the source/drain regions 80 are formed in the recesses 88. The source/drain regions 80 are formed by epitaxially growing a material in the recesses 88, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 8A, the epitaxial source/drain regions 80 may have surfaces raised from respective surfaces of the fins 64 (e.g. raised above the non-recessed upper surface 64U of the fins 64) and may have facets. The source/drain regions 80 of the adjacent fins 64 may merge to form a continuous epitaxial source/drain region 80 (see FIG. 8B). In some embodiments, the source/drain regions 80 of the adjacent fins 64 do not merge together and remain separate source/drain regions 80 (see FIG. 8C). In some embodiments, the resulting FinFET is an n-type FinFET, and source/drain regions 80 comprise silicon carbide (SiC), silicon phosphorous (SiP), phosphorous-doped silicon carbon (SiCP), or the like. In some embodiments, the resulting FinFET is a p-type FinFET, and source/drain regions 80 comprise SiGe, and a p-type impurity such as boron or indium.

The epitaxial source/drain regions 80 may be implanted with dopants to form source/drain regions 80 followed by an anneal process. The implanting process may include forming and patterning masks such as a photoresist to cover the regions of the FinFET device 100 that are to be protected from the implanting process. The source/drain regions 80 may have an impurity (e.g., dopant) concentration in a range from about 1E19 $cm^{-3}$ to about 1E21 $cm^{-3}$. P-type impurities, such as boron or indium, may be implanted in the source/drain region 80 of a P-type transistor. N-type impurities, such as phosphorous or arsenide, may be implanted in the source/drain regions 80 of an N-type transistor. In some embodiments, the epitaxial source/drain regions may be in situ doped during growth.

Figure 9:
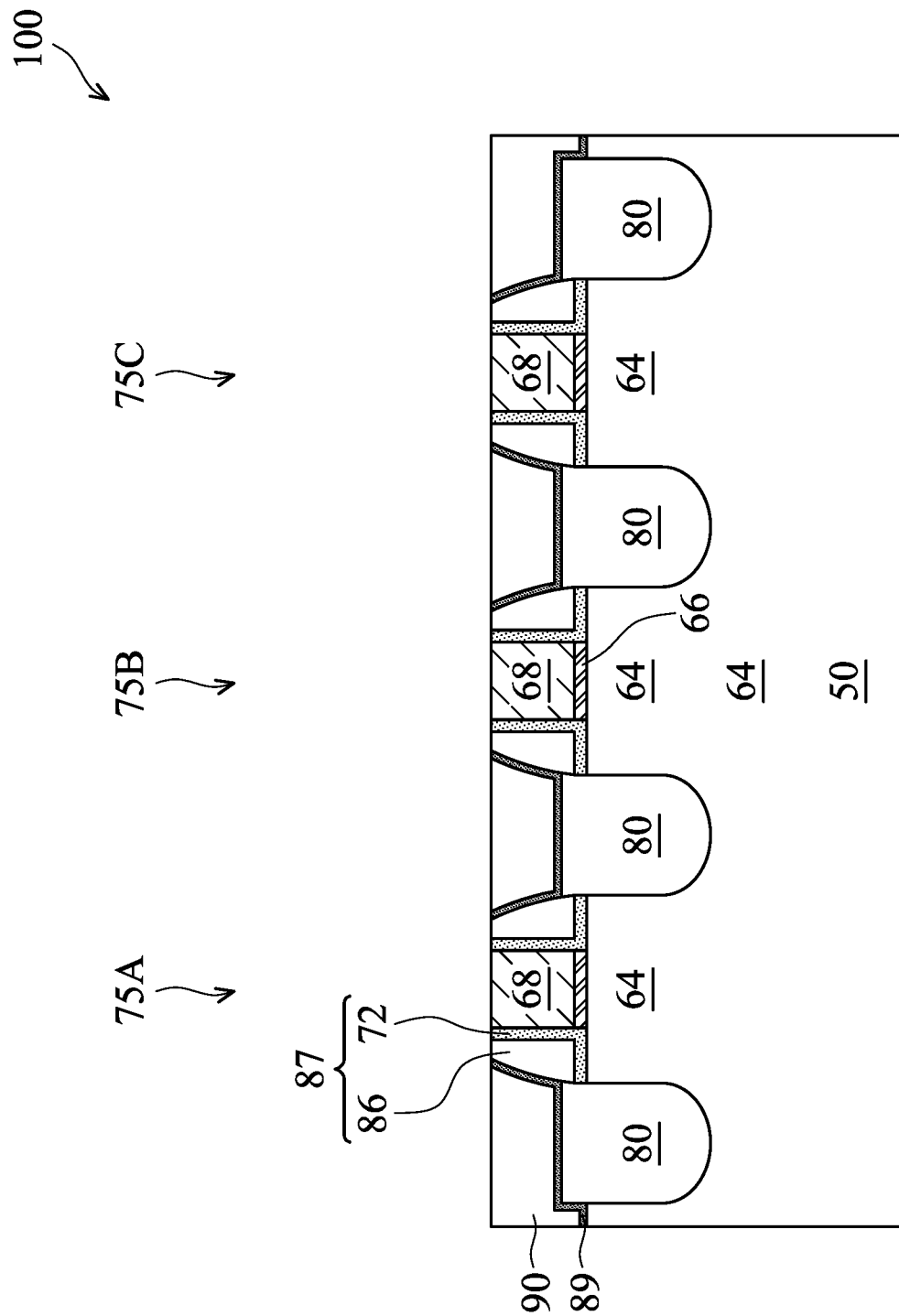

Next, as illustrated in FIG. 9, a contact etch stop layer (CESL) 89 is formed over the structure illustrated in FIG. 8A. The CESL 89 functions as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, a first interlayer dielectric (ILD) 90 is formed over the CESL 89 and over the dummy gate structures 75 (e.g., 75A, 75B, and 75C). In some embodiments, the first ILD 90 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to remove the mask 70 and to remove portions of the CESL 89 disposed over the gate electrode 68. After the planarization process, the top surface of the first ILD 90 is level with the top surface of the gate electrode 68.

Figure 10:
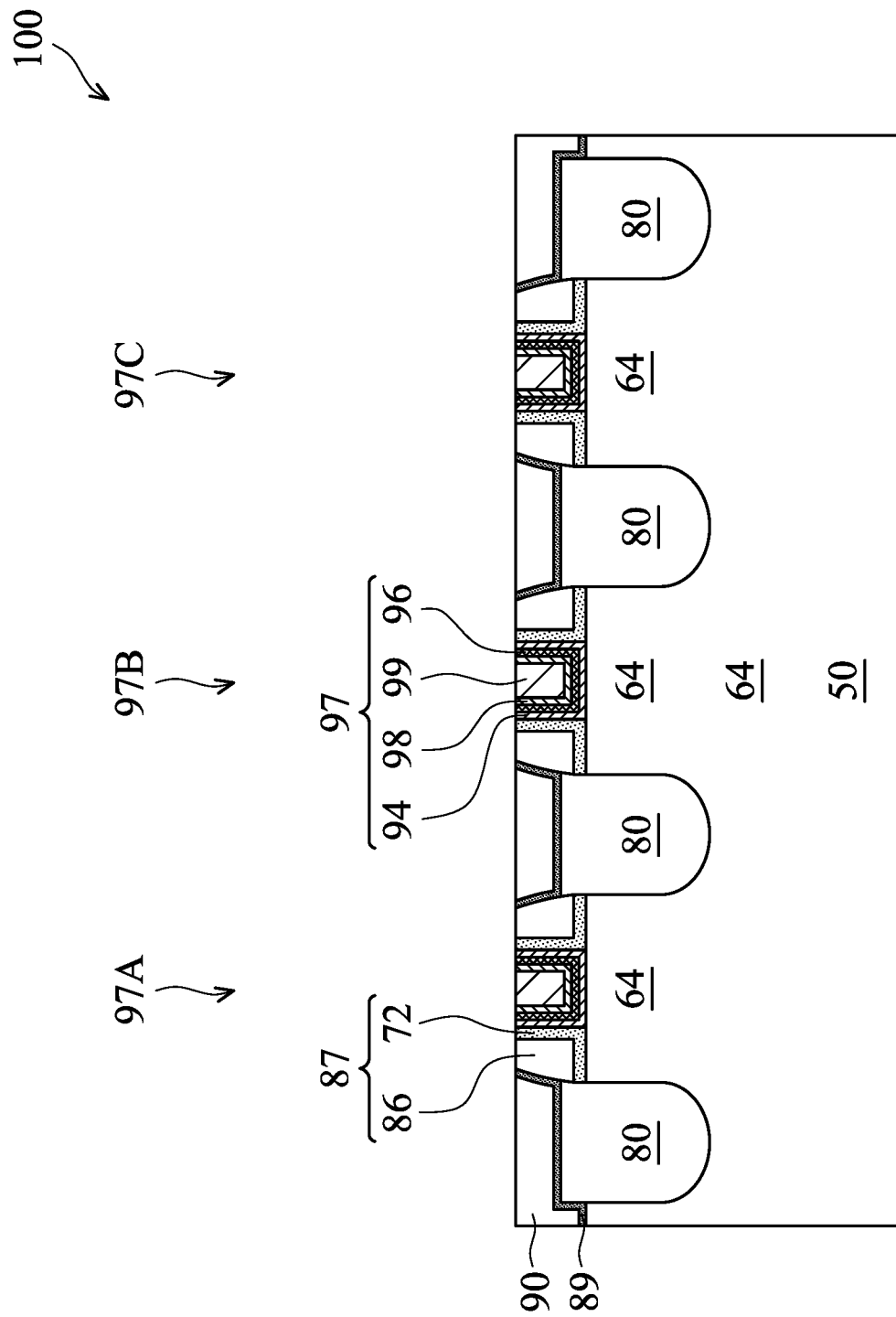

Next, in FIG. 10, an embodiment gate-last process (sometimes referred to as replacement gate process) is performed to replace the gate electrode 68 and the gate dielectric 66 with an active gate (may also be referred to as a replacement gate or a metal gate) and active gate dielectric material(s), respectively. Therefore, the gate electrode 68 and the gate dielectric 66 may be referred to as dummy gate electrode and dummy gate dielectric, respectively, in a gate-last process. The active gate is a metal gate, in some embodiments.

Referring to FIG. 10, the dummy gate structures 75A, 75B, and 75C (see FIG. 9) are replaced by replacement gate structures 97A, 97B, and 97C, respectively. In accordance with some embodiments, to form the replacement gate structures 97 (e.g., 97A, 97B, or 97C), the gate electrode 68 and the gate dielectric 66 directly under the gate electrode 68 are removed in an etching step(s), so that recesses (not shown) are formed between the gate spacers 87. Each recess exposes the channel region of a respective fin 64. During the dummy gate removal, the gate dielectric 66 may be used as an etch stop layer when the gate electrode 68 is etched. The gate dielectric 66 may then be removed after the removal of the gate electrode 68.

Next, a gate dielectric layer 94, a barrier layer 96, a work function layer 98, and a gate electrode 99 are formed in the recesses for the replacement gate structure 97. The gate dielectric layer 94 is deposited conformally in the recesses, such as on the top surfaces and the sidewalls of the fins 64 and on sidewalls of the gate spacers 87, and on a top surface of the first ILD 90 (not shown). In accordance with some embodiments, the gate dielectric layer 94 comprises silicon oxide, silicon nitride, or multilayers thereof. In other embodiments, the gate dielectric layer 94 includes a high-k dielectric material, and in these embodiments, the gate dielectric layers 94 may have a k value greater than about 7.0, and may include a metal oxide or a silicate of Hf, Al, Zr, La, Mg, Ba, Ti, Pb, and combinations thereof. The formation methods of gate dielectric layer 94 may include molecular beam deposition (MBD), atomic layer deposition (ALD), PECVD, and the like.

Next, the barrier layer 96 is formed conformally over the gate dielectric layer 94. The barrier layer 96 may comprise an electrically conductive material such as titanium nitride, although other materials, such as tantalum nitride, titanium, tantalum, or the like, may alternatively be utilized. The barrier layer 96 may be formed using a CVD process, such as PECVD. However, other alternative processes, such as sputtering, metal organic chemical vapor deposition (MOCVD), or ALD, may alternatively be used.

Next, the work function layer 98, such as a P-type work function layer or an N-type work function layer, may be formed in the recesses over the barrier layers 96 and before the gate electrode 99 is formed, in some embodiments. Exemplary P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Exemplary N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), and/or other suitable process.

Next, a seed layer (not shown) is formed conformally over the work function layer 98. The seed layer may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. For example, the seed layer comprises a titanium layer and a copper layer over the titanium layer.

Next, the gate electrode 99 is deposited over the seed layer, and fills the remaining portions of the recesses. The gate electrode 99 may be made of a metal-containing material such as Cu, Al, W, the like, combinations thereof, or multi-layers thereof, and may be formed by, e.g., electroplating, electroless plating, or other suitable method. After the formation of the gate electrode 99, a planarization process, such as a CMP, may be performed to remove the excess portions of the gate dielectric layer 94, the barrier layer 96, the work function layer 98, the seed layer, and the gate electrode 99, which excess portions are over the top surface of the first ILD 90. The resulting remaining portions of the gate dielectric layer 94, the barrier layer 96, the work function layer 98, the seed layer, and the gate electrode 99 thus form the replacement gate structure 97 of the resulting FinFET device 100.

Figure 11:
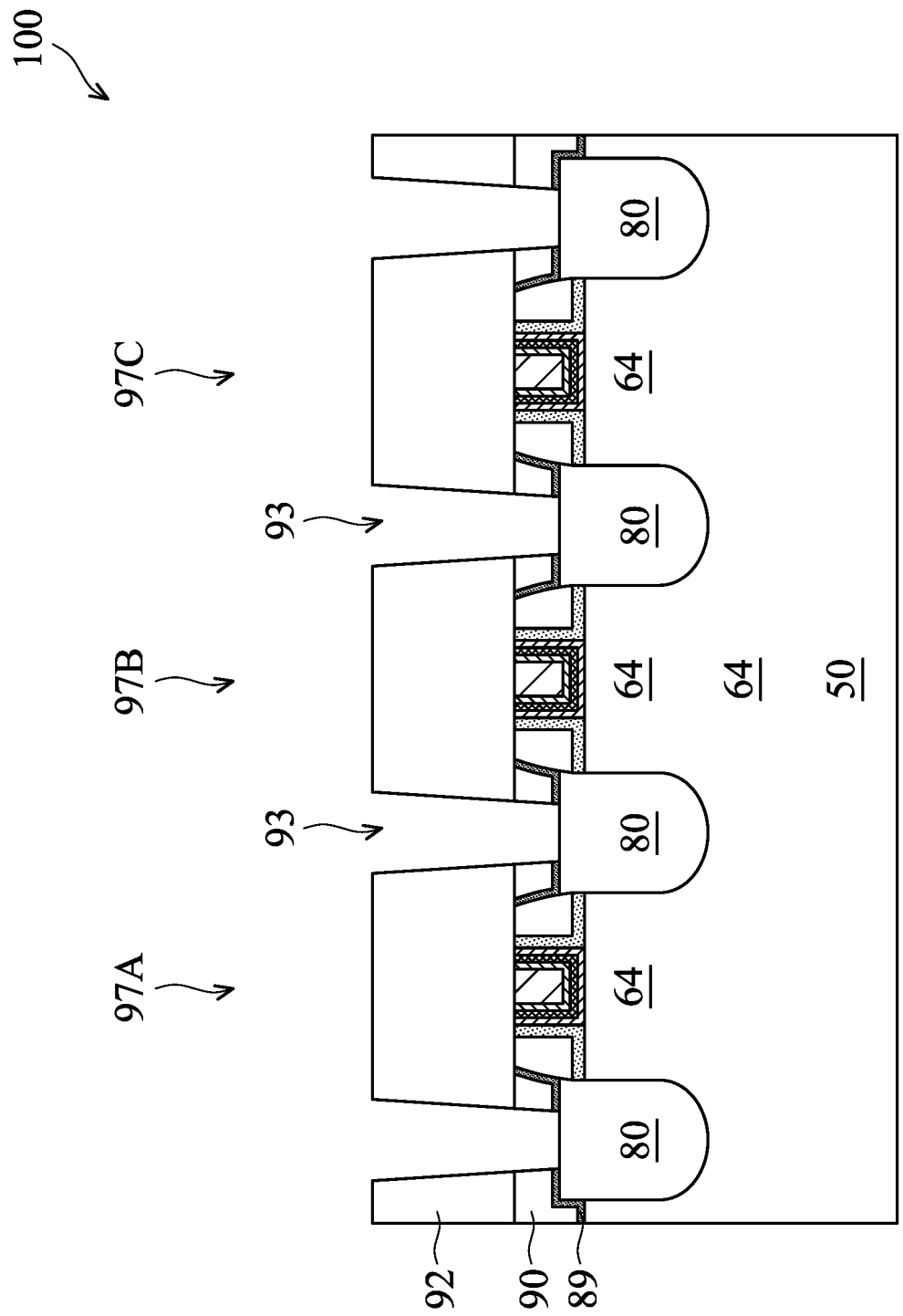

Referring next to FIG. 11, a second ILD 92 is formed over the first ILD 90. Openings 93 are formed through the second ILD 92 and the first ILD 90 to expose the source/drain regions 80.

In an embodiment, the second ILD 92 is a flowable film formed by a flowable CVD method. In some embodiments, the second ILD 92 is formed of a dielectric material such as PSG, BSG, BPSG, USG, or the like, and may be deposited by any suitable method, such as CVD and PECVD. In some embodiments, the second ILD 92 and the first ILD 90 are formed of a same material. In some embodiments, the second ILD 92 and the first ILD 90 are formed of different materials.

In some embodiments, the openings 93 in FIG. 11 are formed using photolithography and etching. The etching process etches through the CESL 89 to expose the source/drain regions 80. In some embodiments, the openings 93 in FIG. 11 are formed using an anisotropic etching process, such as an anisotropic plasma etching process. The anisotropic plasma etching process uses a gas source that comprises $CF_4$, $C_4F_6$, $C_4F_8$, or combinations thereof, in an embodiment. After the anisotropic etching process, the sidewalls of the openings 93 in Figure 11 have a linear profile, e.g., each of the sidewalls of the openings 93 extends along a respective straight line (e.g., a slanted straight line).

Figure 12:
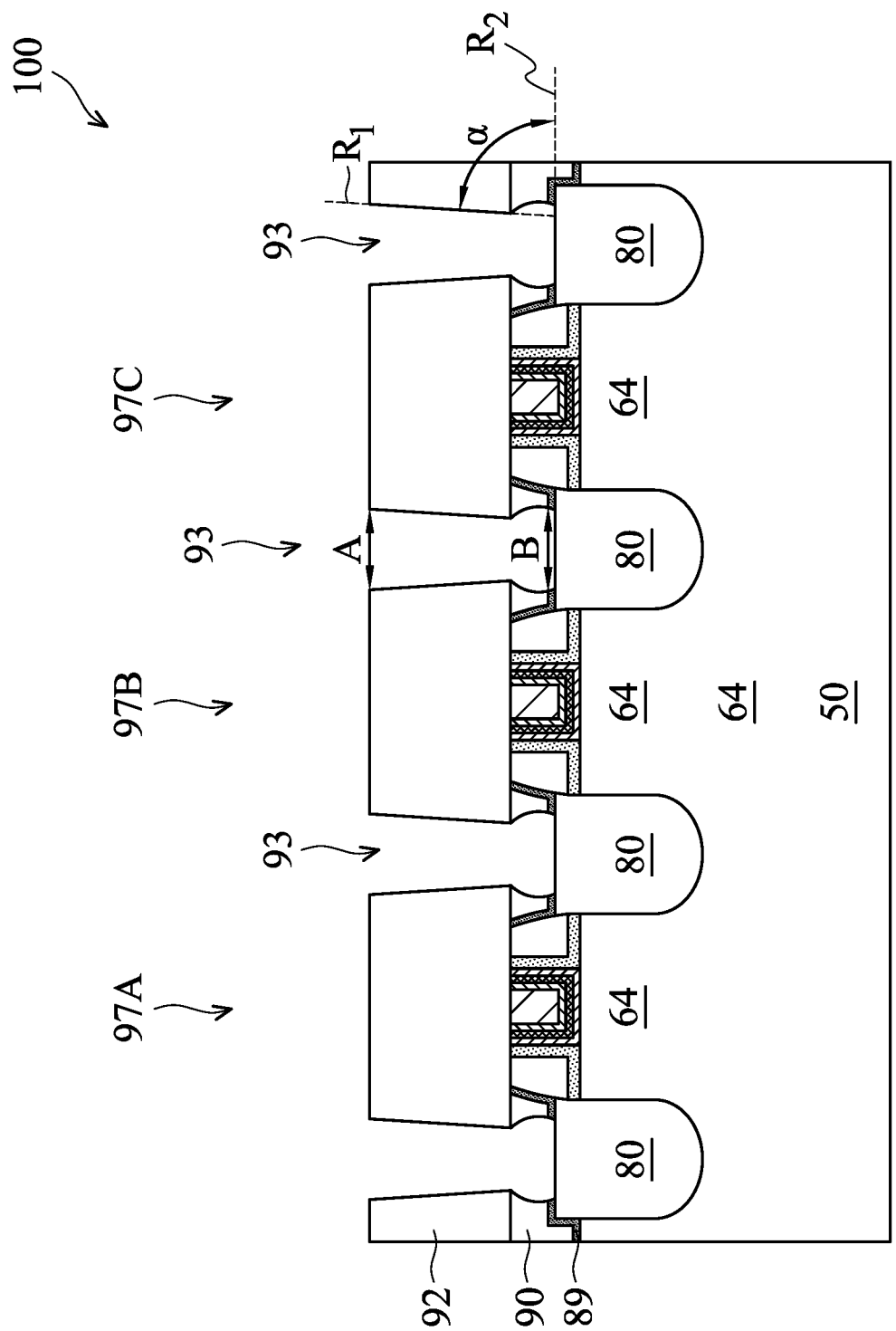

Next, in FIG. 12, an isotropic etching process, such as an isotropic plasma etching process, is performed to expand a lower portion of the openings 93. The isotropic plasma etching process uses a gas source that comprises $Cl_2$, HBr, or combinations thereof, in an embodiment. The bias power (or bias voltage) of the plasma etching tool may be adjusted (e.g., reduced) to achieve isotropic plasmas etching, as an example. In some embodiments, the first ILD 90 and the second ILD 92 are formed of a same or similar material (e.g., first ILD 90 is silicon oxide formed by PECVD and the second ILD 92 is silicon oxide formed by FCVD), and the gas source of the isotropic etching process has a high etching selectivity (e.g., higher etching rate) for the first and second ILDs 90/92 over the source/drain regions 80. During the isotropic etching process, the etching gas in the upper portion of the opening 93 tends to diffuse out of the opening 93, while the etching gas in the lower portion of the opening 93 remains and removes (e.g., etches) portions of the first ILD 90, such that lower portions of the openings 93 (e.g., portions inside the first ILD 90) are enlarge by the isotropic etching process, while upper portions of the openings 93 (e.g., portions in the second ILD 92) remain substantially unchanged, in some embodiments. Therefore, after the isotropic etching process, the upper portions of the openings 93 have a linear sidewall profile, while the lower portions of the openings 93 have a curved sidewall profile, e.g., sidewalls of the lower portions of each opening 93 are curved. Although an isotropic plasma etching process is used as an example, other suit able isotropic etching process, such as a wet etch process, may also be used.

The isotropic etching process increases the volume of the lower portions of the openings 93. As illustrated in FIG. 12, each opening 93 has a first width A at an upper surface of the second ILD 92, and has a second width B at a bottom of the opening 93, wherein B is larger than A. In some embodiments, the second width B is larger than the first width A by a value between about 1 nm and about 5 nm (e.g., 5 nm≥B-A≥1 nm), such as about 1 nm. An angle α between line R1 and line R2 is between about 87 degrees and about 91 degrees, such as about 87 degrees, where line R1 extends along the linear sidewall (e.g., a slanted straight sidewall) of the upper portion of the opening 93, and the line R2 is parallel to a major upper surface of the substrate 50.

Figure 13:
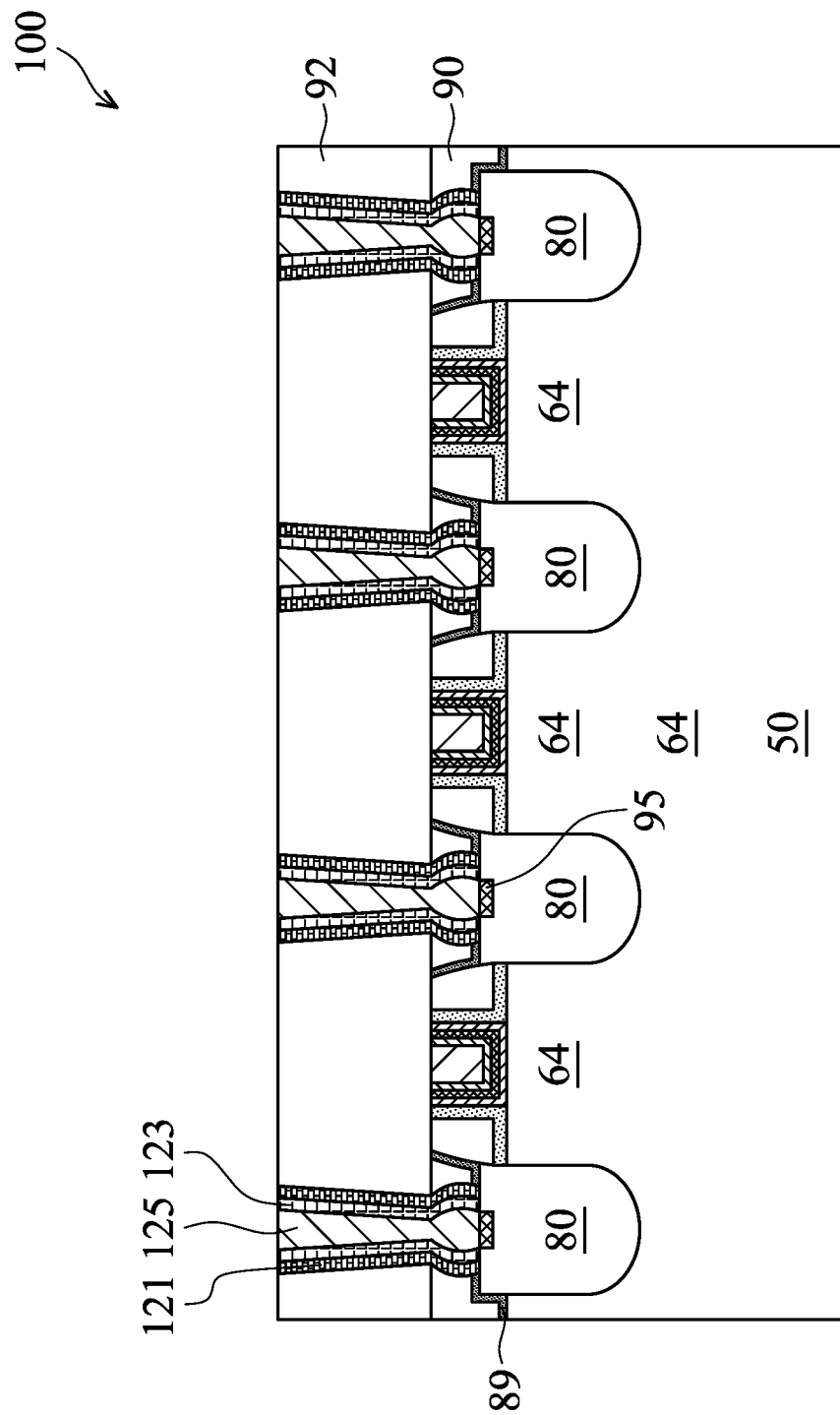

Next, in FIG. 13, a sacrificial layer 121 is formed (e.g., conformally) in the openings 93 along sidewalls of the first ILD 90 and along sidewalls of the second ILD 92. A spacer layer 123 is next formed (e.g., conformally) over and along the sacrificial layer 121. Next, silicide regions 95 are formed at the bottom of the openings 93 over the source/drain regions 80, and an electrically conductive material 125 is formed to fill the openings 93. Details are discussed below.

In an embodiment, the sacrificial layer 121 is a semiconductor layer, such as a silicon layer, and is formed by a suitable deposition process such as ALD, CVD, PECVD, or the like. In some embodiments, the as-deposited sacrificial layer 121 extends conformally along sidewalls and bottoms of the openings 93, and along an upper surface of the second ILD 92. Next, an etching process (e.g., an anisotropic etching process) is performed to remove portions of the sacrificial layer 121 from the bottoms of the openings 93 to expose the underlying source/drain regions 80. The etching process may also remove portions of the sacrificial layer 121 from the upper surface of the second ILD 92. After the etching process, the sacrificial layer 121 is disposed along sidewalls of the openings 93. In subsequent processing, the sacrificial layer 121 is removed to form an air gap between the first ILD/second ILD 90/92 and the spacer layer 123. Although silicon is used as an example for the sacrificial layer 121, any other suitable material (e.g., a material that may be selectively removed by a subsequent etching process) may be used as the sacrificial layer 121.

Next, the spacer layer 123 is formed (e.g., conformally) in the openings 93 and over the sacrificial layer 121. In an embodiment, the spacer layer 123 is a dielectric layer, such as a silicon nitride layer, and is formed by a suitable deposition process such as ALD, CVD, PECVD, or the like. The spacer layer 123 is formed using a material different from the material of the sacrificial layer 121 to provide etching selectivity, such that in a subsequent etching process to remove the sacrificial layer 121, the sacrificial layer 121 is removed without substantially attacking the spacer layer 123.

In some embodiments, the as-deposited spacer layer 123 extends conformally along sidewalls and bottoms of the openings 93, and along an upper surface of the second ILD 92. Next, another etching process (e.g., an anisotropic etching process) is performed to remove portions of the spacer layer 123 from the bottoms of the openings 93 to expose the underlying source/drain regions 80. The another etching process may also remove portions of the spacer layer 123 from the upper surface of the second ILD 92. After the another etching process, the spacer layer 123 is disposed along sidewalls of the openings 93 over the sacrificial layer 121.

Next, the silicide regions 95, which may be optional, are formed in the openings 93 over the source/drain regions 80. In some embodiments, the silicide regions 95 are formed by first depositing a metal capable of reacting with semiconductor materials (e.g., silicon, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 80, then performing a thermal anneal process to form the silicide regions 95. The un-reacted portions of the deposited metal are then removed, e.g., by an etching process. Although regions 95 are referred to as silicide regions, regions 95 may also be germanide regions, or silicon germanide regions (e.g., regions comprising silicide and germanide).

Next, a barrier layer (not illustrated) is formed (e.g., conformally) in the openings 93. The barrier layer may comprise an electrically conductive material such as titanium nitride, although other materials, such as tantalum nitride, titanium, tantalum, or the like, may alternatively be utilized. The barrier layer may be formed using ALD, CVD, PECVD, MOCVD, or the like.

Next, the electrically conductive material 125 is formed in the openings 93 to fill the openings 93. The electrically conductive material 125 may be made of a metal-containing material such as Cu, Al, W, the like, combinations thereof, or multi-layers thereof, and may be formed by, e.g., electroplating, electroless plating, or other suitable method. A planarization process, such as CMP, may be performed to remove excess portions of the layers (e.g., 121, 123, the barrier layer, and 125) that are disposed over the upper surface of the second ILD 92. Note that due to the enlarged lower portion of the openings 93, the electrically conductive material 125 also has enlarged lower portions, which advantageously reduces the electrically resistance of the contact plugs formed. For example, the electrically conductive material 125 in each opening 93 has an upper portion with a linear sidewall profile and a lower portion with a curved sidewall profile, and the lower portion is wider than the upper portion.

Figure 14A:
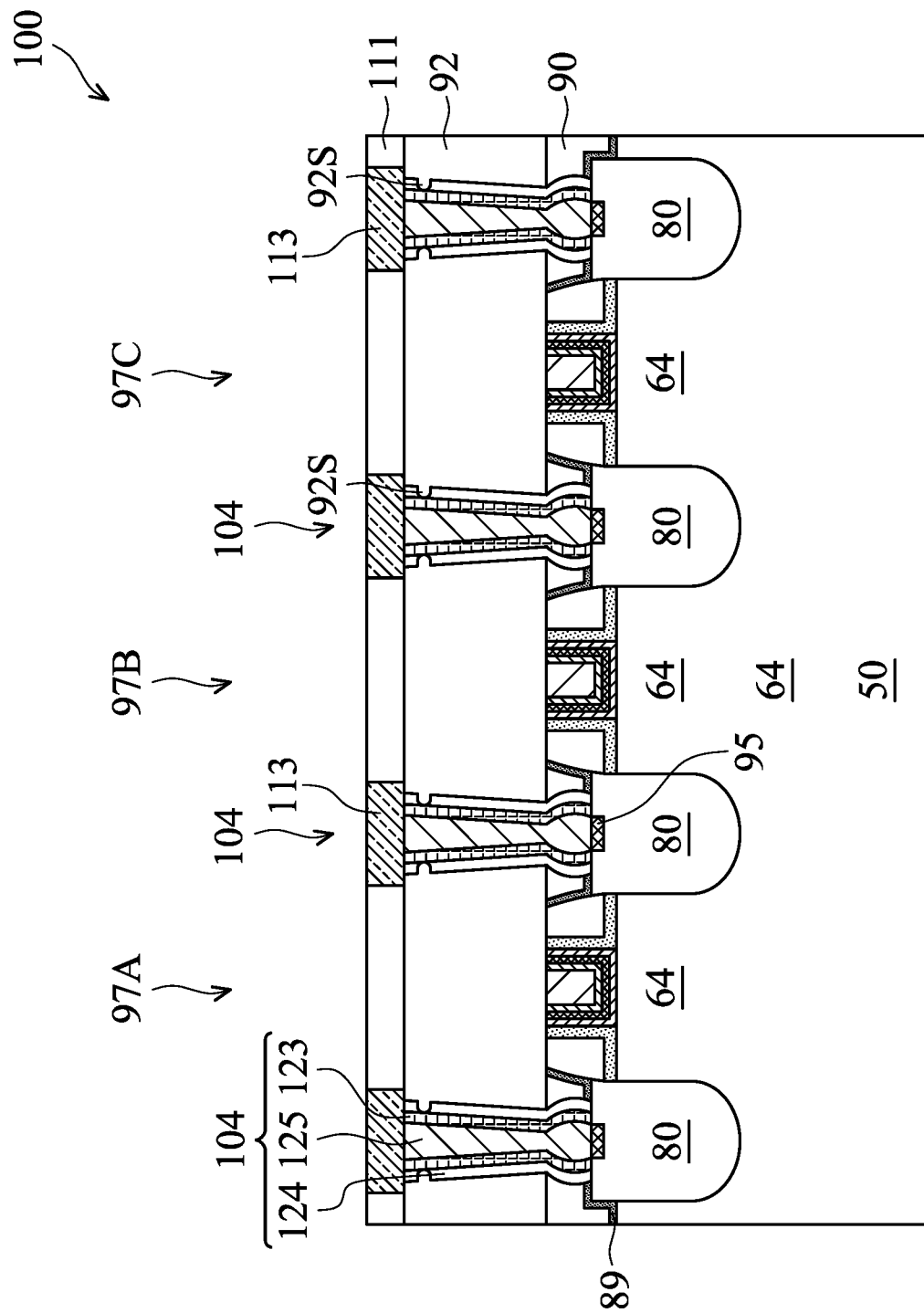
Figure 14B:
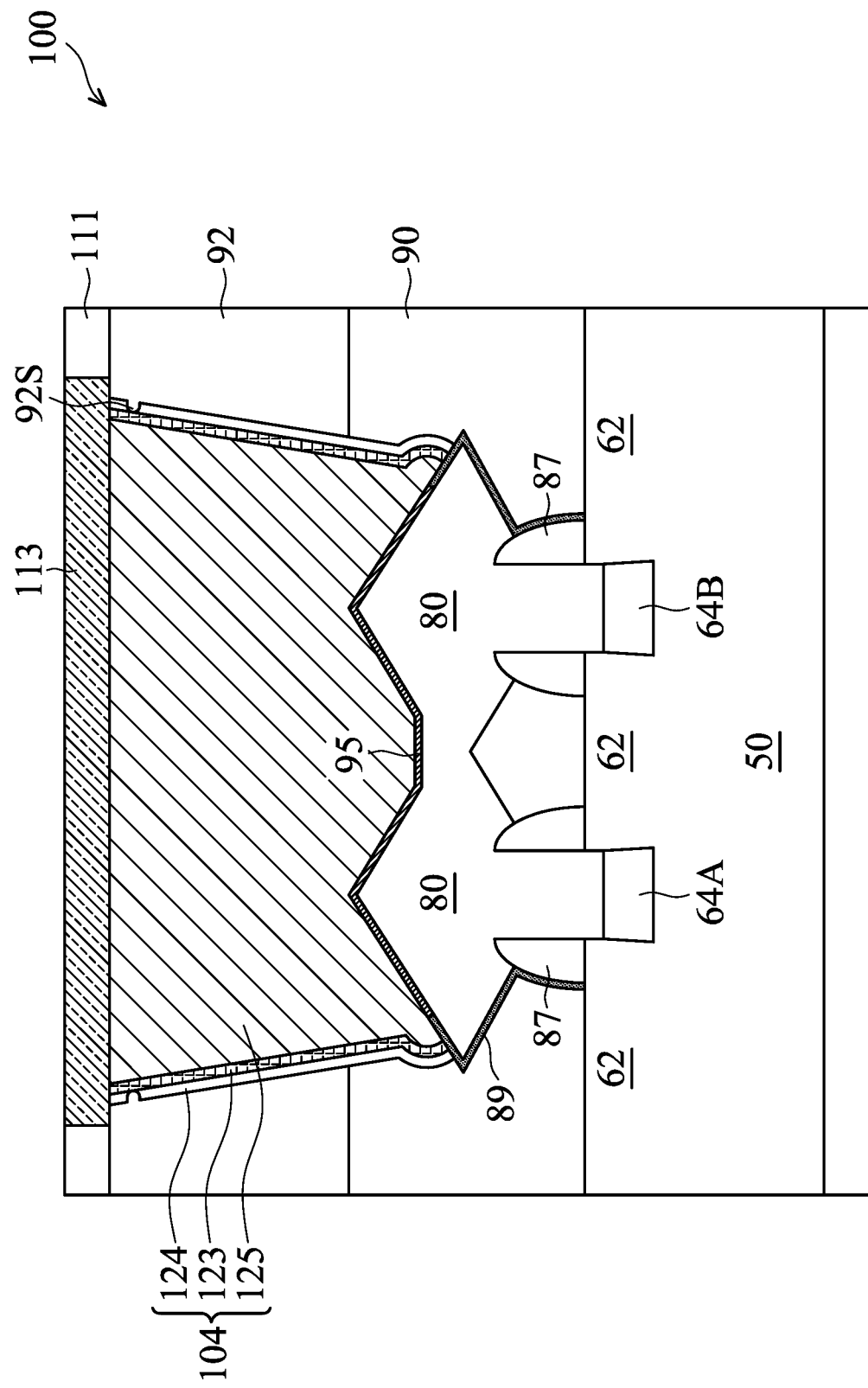
Figure 14C:
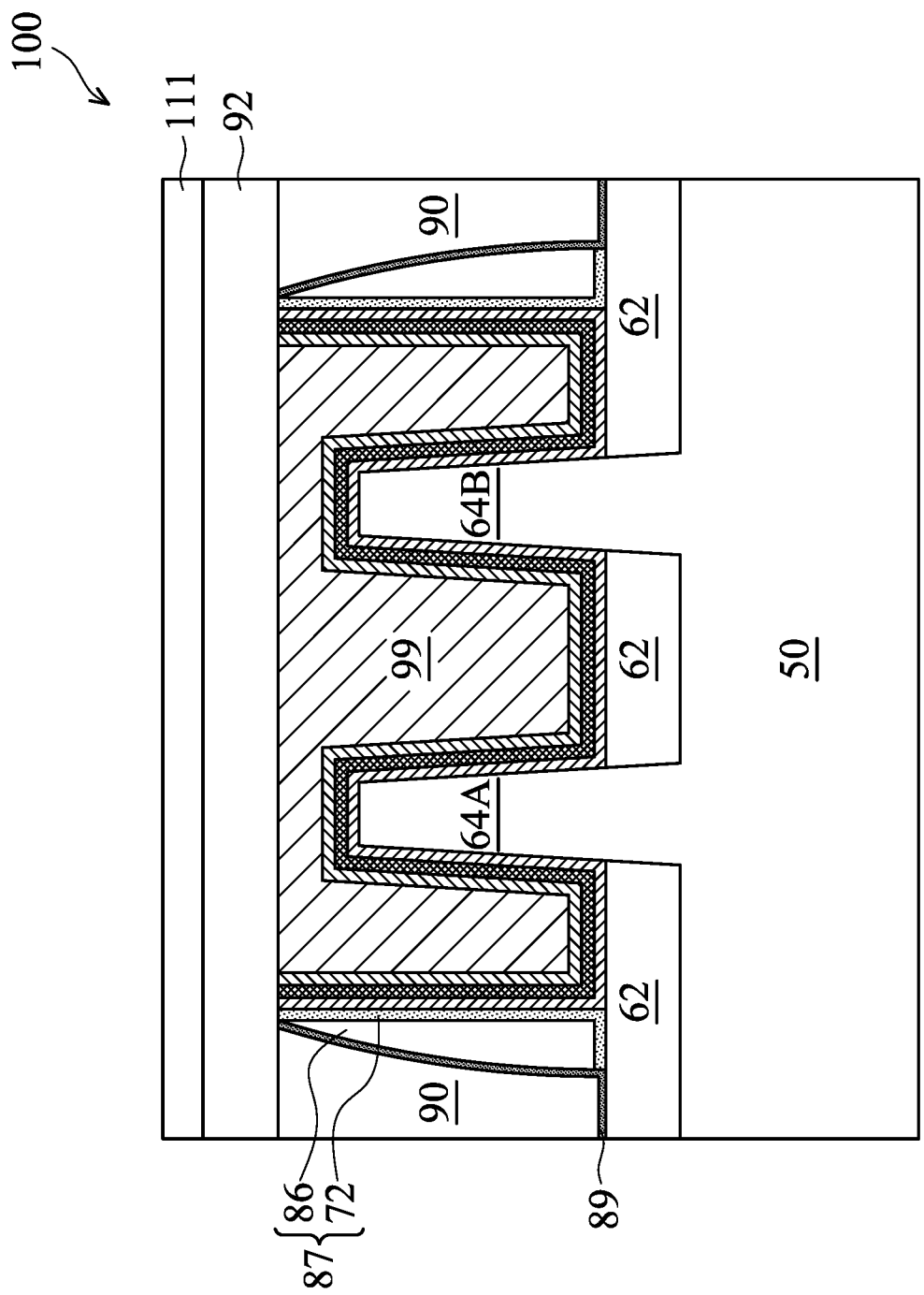

Next, in FIG. 14A, a selective etching process is performed to remove the sacrificial layer 121. In an embodiment, sacrificial layer 121 is a silicon layer, and the chemical used in the selective etching process comprises hydrogen ($H_2$) and nitride fluoride ($NF_3$). In another embodiment, the sacrificial layer 121 is selectively removed using a chemical comprising ammonium hydroxide ($NH_4OH$). Note that the selective etching process to remove the sacrificial layer 121 is different from the etching processes to form the openings 93. After the selective etching process, air gaps 124 are formed between the first ILD/second ILD 90/92 and the spacer layer 123. The air gaps 124 advantageously reduce the capacitance of the device formed due to the air gaps reducing the average dielectric constant (K-value) of the dielectric material (e.g., first ILD 90 and second ILD 92) around the contact plugs formed. The air gap 124, the spacer layer 123, the barrier layer, and the electrically conductive material 125 in each opening 93 thus form a contact plug 104 that has a re-entrant profile. The contact plugs 104 in FIG. 14A are electrically coupled to the source/drain regions 80, thus are also referred to as source/drain contact plugs.

Next, an impurity (e.g., Ge) is implanted into the top portion of the second ILD 92 by an implantation process to seal (at least partially) the air gap 124, and subsequently, a dielectric layer 111 is formed over the second ILD 92. In some embodiments, the implantation process implants a suitable impurity, such as germanium, into the top portion of the second ILD 92. The implantation process causes the top portion of the second ILD 92 to swell (e.g., expand), and therefore, seal (e.g., completely seal or partially seal) the air gap 124. As illustrated in FIG. 14A, a portion 92S (caused by swelling of the top portion of the second ILD 92), which may comprise the impurity (e.g., Ge), seals the air gap 124. Electrically conductive features 113, such as conductive lines, are formed in the dielectric layer 111. The dielectric layer 111 and/or the electrically conductive feature 113 in the dielectric layer 111 may further seal the air gap 124. Additional processing may follow the processing of FIG. 14A to finish the fabrication of the FinFET device 100, as one skilled in the art readily appreciates, details are not repeated here.

FIG. 14B illustrate the FinFET device 100 of FIG. 14A, but along cross-section C-C. FIG. 14C illustrate the FinFET device 100 of FIG. 14A, but along cross-section B-B.

Figure 15:
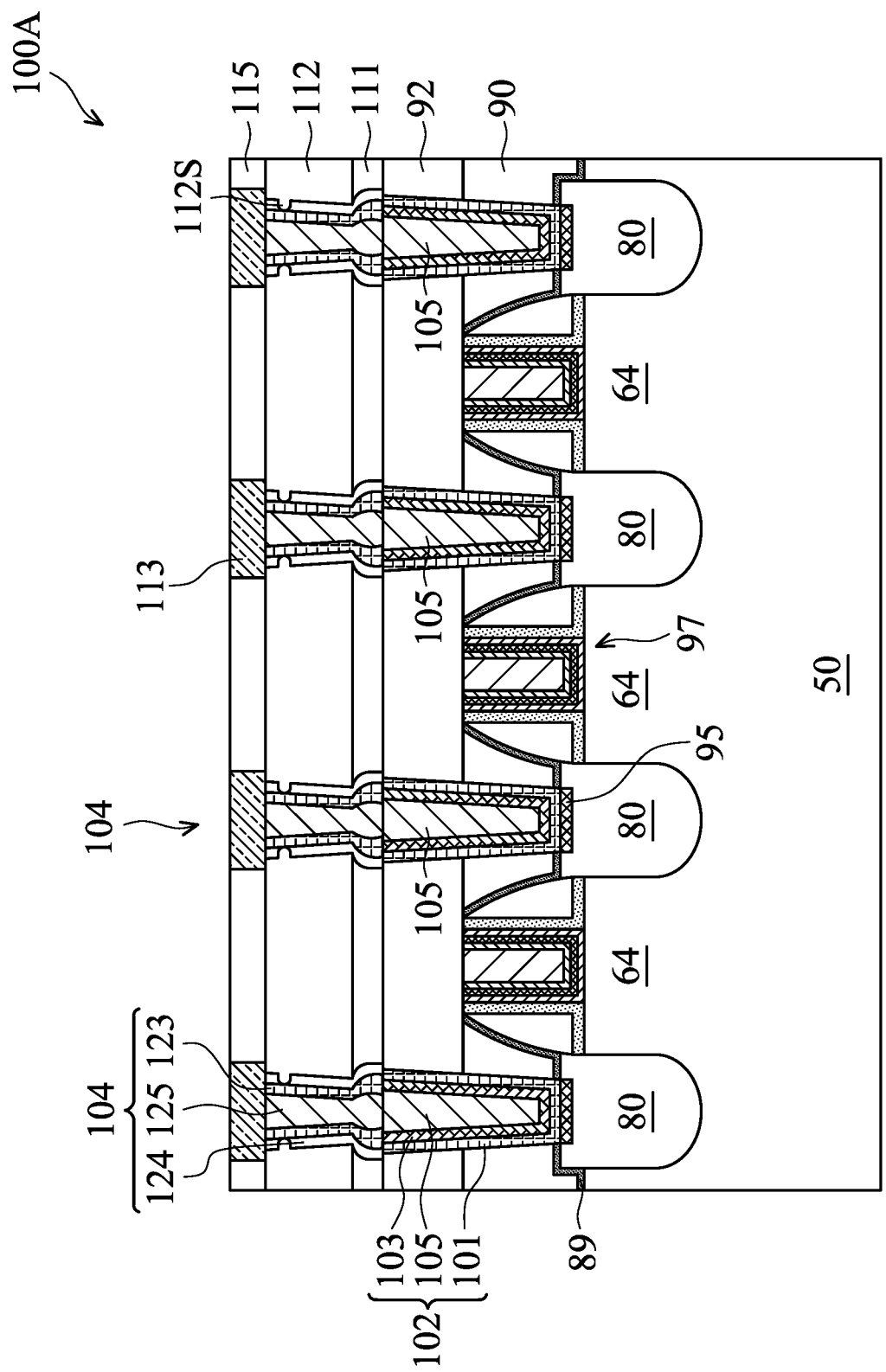
FIG. 15 illustrates a cross-sectional view of a FinFET device, in accordance with another embodiment.

FIG. 15 illustrates a cross-sectional view of a FinFET device 100A, in accordance with another embodiment. The FinFET device 100A is similar to the FinFET device 100, but with the contact plugs 104 (also referred to as via-to-contact plugs) formed in dielectric layers 111/112, which dielectric layers 111/112 are disposed over the second ILD 92. In other words, the source/drain regions 80 are electrically coupled to contact plugs 102 (which may or may not have the re-entrant profile) first, then the via-to-contact plugs 104 are formed over and electrically coupled to the underlying contact plugs 102. The contact plugs 102 in the example of FIG. 15 do not have re-entrant profile. In other embodiments, the contact plugs 102 in FIG. 15 may be replaced with contact plugs with re-entrant profile, such as the contact plugs 104.

In FIG. 15, the contacts plugs 102 (may also be referred to as contacts) are formed in the first ILD 90 and the second ILD 92. Each of the contacts 102 includes a barrier layer 101, a seed layer 103, and a conductive material 105, and is electrically coupled to the underlying conductive feature (e.g., a source/drain region 80). The materials and the formation methods for the barrier layers 101, the seed layer 103 and the conductive material 105 may be the same as or similar to those discussed above for the barrier layers 96, the seed layer, and the gate electrode 99 of the replacement gate structure 97, respectively, thus details are not repeated. The contact plugs 104 may be formed using a same or similar processing steps as illustrated in FIGS. 11-14A. As illustrated in FIG. 15, an impurity, such as germanium, may be implanted in the top portion of the dielectric layer 112 to cause it to swell, such that a portion 112S of the dielectric layer 112 seals (e.g., completely seals or partially seals) a respective air gap 124. The dielectric layer 115 and/or the electrically conductive feature 113 in the dielectric layer 115 may further seal the air gap 124.

Figure 16:
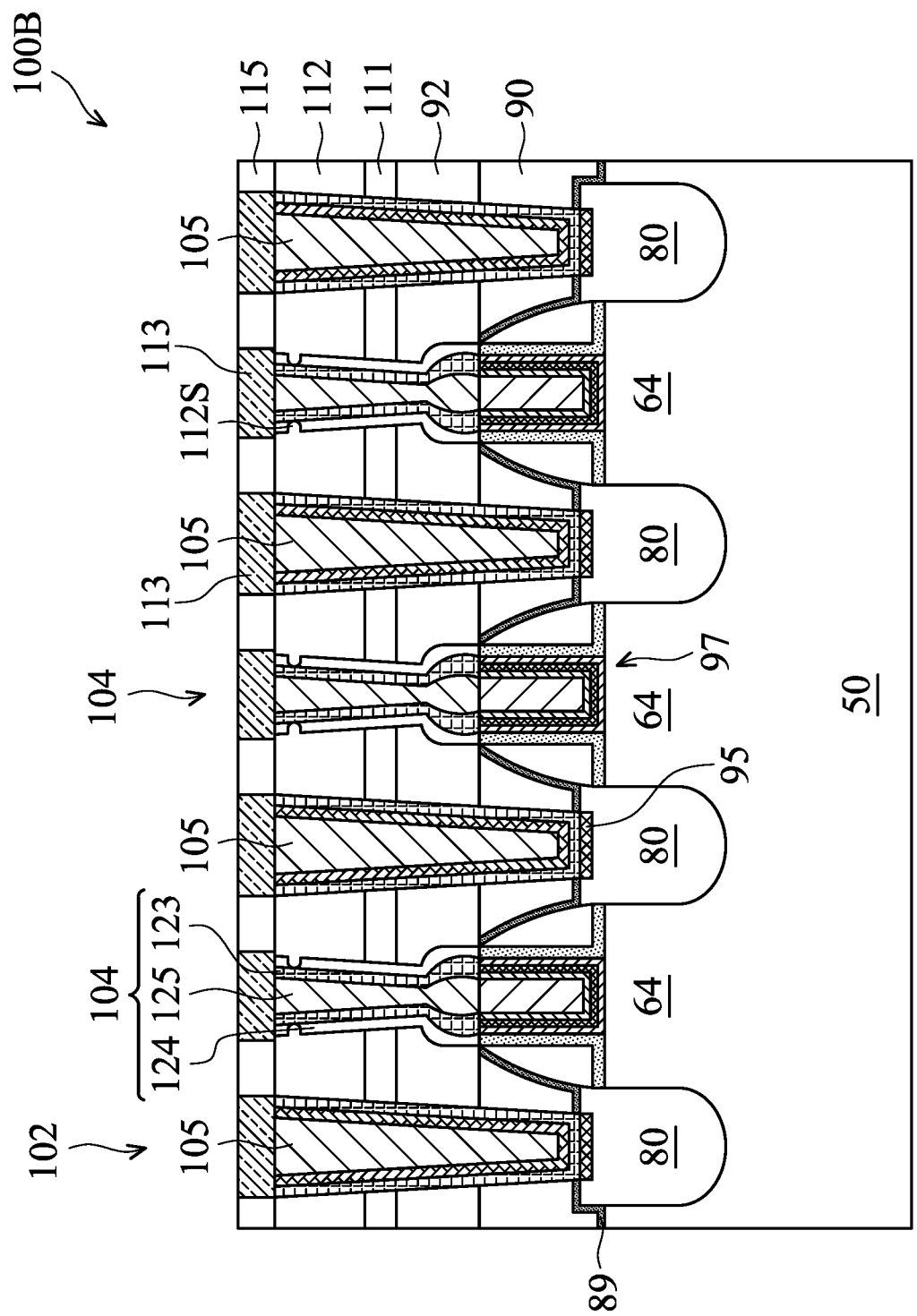
FIG. 16 illustrates a cross-sectional view of a FinFET device, in accordance with yet another embodiment.

FIG. 16 illustrates a cross-sectional view of a FinFET device 100B, in accordance with another embodiment. The FinFET device 100B is similar to the FinFET device 100, but with the contact plugs 104 (also referred to as via-to-gate plugs) with re-entrant profile formed in dielectric layers 111/112 and in first ILD/second ILD 90/92, and electrically coupled to replacement gate structures 97.

Variations to the disclosed embodiments are possible and are fully intended to be included within the scope of the present disclosure. For example, combination of the via-to-contact plug 104 (with the re-entrant profile) and the underlying contact plug 102 (see, e.g., FIG. 15) may be used to replace contact plug 102 used alone as contacts for electrical connection, such as the contact plug 102 in FIG. 16.

Figure 17:
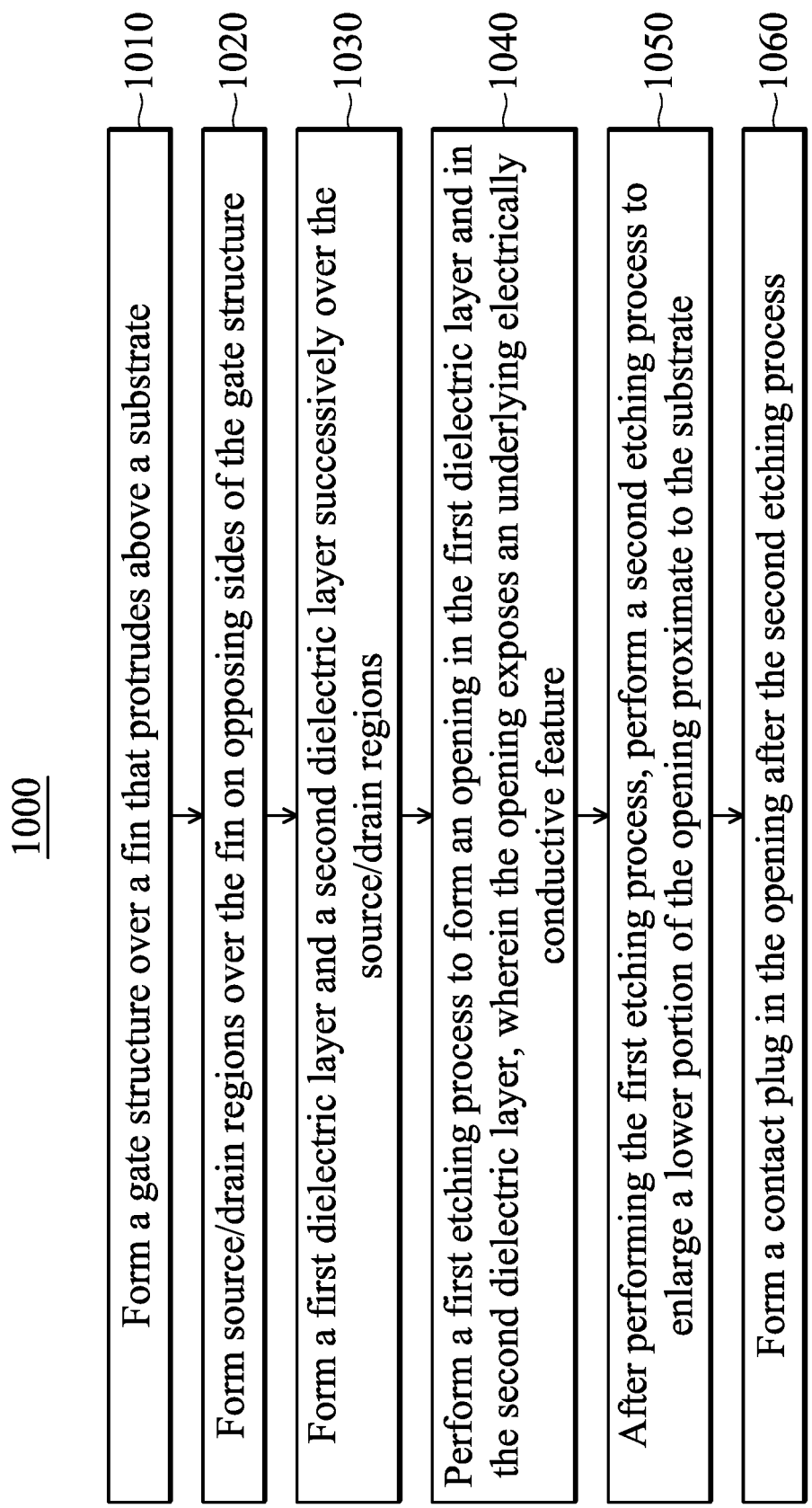
FIG. 17 illustrates a flow chart of method of forming a semiconductor device, in accordance with some embodiments.

FIG. 17 illustrates a flow chart of a method 1000 of forming a semiconductor device, in accordance with some embodiments. It should be understood that the embodiment method shown in FIG. 17 is merely an example of many possible embodiment methods. One of ordinary skill in the art would recognize many variations, alternatives, and modifications. For example, various steps as illustrated in FIG. 17 may be added, removed, replaced, rearranged and repeated.

Referring to FIG. 17, at step 1010, a gate structure is formed over a fin that protrudes above a substrate. At step 1020, source/drain regions are formed over the fin on opposing sides of the gate structure. At step 1030, a first dielectric layer and a second dielectric layer are formed successively over the source/drain regions. At step 1040, a first etching process is performed to form an opening in the first dielectric layer and in the second dielectric layer, wherein the opening exposes an underlying electrically conductive feature. At step 1050, after performing the first etching process, a second etching process is performed to enlarge a lower portion of the opening proximate to the substrate. At step 1060, a contact plug is formed in the opening after the second etching process.

Embodiments may achieve advantages. For example, the disclosed cleaning method allows the contact plugs formed to have enlarged lower portions, thereby reducing the electrical resistance of the contact plugs formed. In addition, the air gap of the contact plugs helps to prevent or reduce metal diffusion, and may additionally reduce the average dielectric constant value (k-value) of the device formed.

In accordance with an embodiment, a method of forming a semiconductor device includes: forming a gate structure over a fin that protrudes above a substrate; forming source/drain regions over the fin on opposing sides of the gate structure; forming a first dielectric layer and a second dielectric layer successively over the source/drain regions; performing a first etching process to form an opening in the first dielectric layer and in the second dielectric layer, wherein the opening exposes an underlying electrically conductive feature; after performing the first etching process, performing a second etching process to enlarge a lower portion of the opening proximate to the substrate; and forming a contact plug in the opening after the second etching process. In an embodiment, the first etching process is an anisotropic etching process. In an embodiment, the second etching process is an isotropic etching process. In an embodiment, after the first etching process and before the second etching process, the opening has a linear sidewall profile, wherein after the second etching process, the lower portion of the opening has a curved sidewall profile, and an upper portion of the opening distal from the substrate has a linear profile. In an embodiment, after the second etching process, the lower portion of the opening has a first width, and an upper portion of the opening distal from the substrate has a second width, wherein the first width is larger than the second width. In an embodiment, the first etching process is an anisotropic plasma etching process performed using a gas source comprising $CF_4$, $C_4F_6$ or $C_4F_8$. In an embodiment, the second etching process is an isotropic plasma etching process performed using a gas source comprising $Cl_2$, or HBr. In an embodiment, forming the contact plug comprises: forming a sacrificial layer lining sidewalls of the opening; forming a spacer layer over the sacrificial layer; filling the opening with an electrically conductive material; and removing the sacrificial layer after filling the opening, wherein after removing the sacrificial layer, an air gap is formed between the first and second dielectric layers and the spacer layer. In an embodiment, the sacrificial layer is formed along the sidewalls of the opening, and a bottom of the opening is free of the sacrificial layer. In an embodiment, the method further comprises, after removing the sacrificial layer, forming a third dielectric layer over the second dielectric layer, the third dielectric layer sealing the air gap. In an embodiment, the spacer layer is formed using a nitride, and the sacrificial layer is formed using a semiconductor material. In an embodiment, the nitride is silicon nitride, and the semiconductor material is silicon.

In accordance with an embodiment, a method of forming a semiconductor device includes: forming a gate structure over a fin that protrudes above a substrate; forming a source/drain region over the fin adjacent to gate structure; forming a first dielectric layer over the source/drain region and around the gate structure; forming a second dielectric layer over the first dielectric layer; forming an opening that extends into the first dielectric layer and the second dielectric layer using a first etching process, wherein the opening exposes an underlying electrically conductive feature; increasing a volume of the opening in the first dielectric layer using a second etching process; forming a sacrificial layer along sidewalls of the opening; forming a spacer layer along the sacrificial layer; and filling the opening with an electrically conductive material; and removing the sacrificial layer after filling the opening, wherein an air gap is formed between the first and the second dielectric layers and the electrically conductive material after removing the sacrificial layer. In an embodiment, the method further comprises sealing the air gap by forming a third dielectric layer over the second dielectric layer. In an embodiment, the first etching process is an anisotropic etching process, and the second etching process is an isotropic etching process. In an embodiment, the second etching process is performed using an etchant that is selective to a material of the first dielectric layer.

In accordance with an embodiment, a semiconductor device includes: a fin protruding above a substrate; a gate structure over the fin; source/drain regions on opposing sides of the gate structure; dielectric layers over the source/drain regions; and a contact plug extending through the dielectric layers and electrically coupled to an underlying electrically conductive feature, wherein an upper portion of the contact plug has a linear sidewall profile, and a lower portion of the contact plug has a curved sidewall profile. In an embodiment, a width of the lower portion of the contact plug proximate to the substrate is larger than a width of the upper portion of the contact plug distal from the substrate. In an embodiment, the contact plug comprises: an electrically conductive material; a spacer layer around the electrically conductive material; and an air gap between the spacer layer and the dielectric layers. In an embodiment, the underlying electrically conductive feature is one of the source/drain regions, the gate structure, or a via connected to the gate structure or connected to one of the source/drain regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming one or more dielectric layers over a transistor, wherein the transistor includes a gate structure over a substrate and includes source/drain regions on opposing sides of the gate structure;
    forming an opening in the one or more dielectric layers, wherein a lower portion of the opening proximate to the substrate is formed to be wider than an upper portion of the opening distal from the substrate; and
    forming a contact plug in the opening, comprising:
        lining sidewalls of the opening with a sacrificial layer;
        filling the opening with an electrically conductive material after lining the sidewalls;
        removing the sacrificial layer after filling the opening, wherein after removing the sacrificial layer, an air gap is formed between the one or more dielectric layers and the electrically conductive material; and
        after removing the sacrificial layer, performing an implantation process to the one or more dielectric layers, wherein the implantation process expands an upper portion of the one or more dielectric layers to seal the air gap.

2. The method of claim 1, wherein forming the opening comprises:
    performing a first etching process to form the opening in the one or more dielectric layers; and
    after performing the first etching process, performing a second etching process different from the first etching process to expand the lower portion of the opening.

3. The method of claim 2, wherein after performing the first etching process and before performing the second etching process, the opening has a liner sidewall profile, wherein after the second etching process, the lower portion of the opening has curved sidewalls while the upper portion of the opening has linear sidewalls.

4. The method of claim 1, wherein the implantation process implants a dopant in the upper portion of the one or more dielectric layers, wherein a lower portion of the one or more dielectric layers is free of the dopant.

5. The method of claim 1, wherein the implantation process results in a protrusion portion of the one or more dielectric layers to be formed, wherein the protrusion portion protrudes into the air gap.

6. The method of claim 5, wherein the protrusion portion partially seals the air gap.

7. The method of claim 5, further comprising, after forming the contact plug, forming a second dielectric layer over the one or more dielectric layers and over the air gap.

8. The method of claim 7, wherein the second dielectric layer completely seals the air gap.

9. The method of claim 7, wherein a lower portion of the air gap is between the protrusion portion and the substrate, and an upper portion of the air gap is between the protrusion portion and the second dielectric layer.

10. The method of claim 7, further comprising forming a conductive line in the second dielectric layer, wherein the conductive line overlies the air gap and seals the air gap.

11. The method of claim 10, wherein a lower surface of the conductive line is level with a lower surface of the second dielectric layer facing the substrate.

12. A method of forming a semiconductor device, the method comprising:
    forming a gate structure over a fin that protrudes above a substrate;
    forming a source/drain region over the fin adjacent to the gate structure;
    forming a first dielectric layer over the source/drain region and around the gate structure;
    forming a second dielectric layer over the first dielectric layer;
    forming an opening that extends into the first dielectric layer and the second dielectric layer, wherein the opening exposes an underlying electrically conductive feature;
    increasing a volume of the opening in the first dielectric layer;
    lining sidewalls of the opening with a sacrificial layer;
    filling the opening with an electrically conductive material after the lining;
    removing the sacrificial layer after filling the opening, wherein an air gap is formed between the first and the second dielectric layers and the electrically conductive material after removing the sacrificial layer; and
    expanding an upper portion of the second dielectric layer to at least partially seal the air gap.

13. The method of claim 12, wherein expanding the upper portion of the second dielectric layer comprises performing an implantation process to implant a dopant into the upper portion of the second dielectric layer.

14. The method of claim 13, wherein a lower portion of the second dielectric layer is free of the dopant.

15. The method of claim 12, wherein forming the opening comprises performing an anisotropic etching process, wherein increasing the volume of the opening comprises performing an isotropic etching process.

16. The method of claim 12, further comprising, after lining the sidewalls of the opening and before filling the opening, forming a spacer layer in the opening over the sacrificial layer, wherein the air gap is between the spacer layer and the first and the second dielectric layers.

17. A method of forming a semiconductor device, the method comprising:

forming a gate structure over a fin that protrudes above a substrate;

forming source/drain regions over the fin on opposing sides of the gate structure;

forming one or more dielectric layers over the source/drain regions;

forming an opening in the one or more dielectric layers, wherein the opening exposes an underlying electrically conductive feature;

forming a sacrificial layer along sidewalls of the opening;

filling the opening with an electrically conductive material;

after the filling, removing the sacrificial layer to form an air gap between the one or more dielectric layers and the electrically conductive material; and sealing the air gap after removing the sacrificial layer, wherein sealing the air gap comprises performing an implantation process to the one or more dielectric layers.

18. The method of claim 17, wherein the implantation process implants a dopant in an upper portion of the one or more dielectric layers, wherein the implantation process increases a volume of the upper portion of the one or more dielectric layers.

19. The method of claim 18, wherein a lower portion of the one or more dielectric layers is free of the dopant.

20. The method of claim 18, wherein the upper portion of the one or more dielectric layers comprises a protrusion portion that extends into the air gap, wherein the method further comprises:

after performing the implantation process, forming a second dielectric layer over the air gap and over the one or more dielectric layers, wherein the air gap comprises an upper portion between the second dielectric layer and the protrusion portion, and comprises a lower portion between the protrusion portion and the underlying electrically conductive feature.

* * * * *